United States Patent
Inamori et al.

(10) Patent No.: US 7,245,170 B2
(45) Date of Patent: Jul. 17, 2007

(54) ATTENUATOR AND PORTABLE TELEPHONE TERMINAL APPARATUS USING THE SAME

(75) Inventors: Masahiko Inamori, Ibaraki (JP); Tsunehiro Takagi, Nagaokakyo (JP); Masao Nakayama, Ritto (JP); Kaname Motoyoshi, Nishinomiya (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 370 days.

(21) Appl. No.: 10/880,391

(22) Filed: Jun. 30, 2004

(65) Prior Publication Data

US 2005/0003784 A1    Jan. 6, 2005

(30) Foreign Application Priority Data

Jul. 1, 2003 (JP) .............................. 2003-189526
Mar. 31, 2004 (JP) .............................. 2004-103320

(51) Int. Cl.
*H03L 5/00* (2006.01)
(52) U.S. Cl. ..................... 327/308; 327/306; 333/81 R
(58) Field of Classification Search ................ 327/551, 327/306, 308, 419, 427, 436, 437; 333/81 R
See application file for complete search history.

(56) References Cited

U.S. PATENT DOCUMENTS

| | | | |
|---|---|---|---|
| 4,890,077 A | 12/1989 | Sun | 333/81 A |
| 5,345,123 A * | 9/1994 | Staudinger et al. | 327/308 |
| 5,721,757 A | 2/1998 | Banh et al. | 375/345 |
| 5,852,770 A | 12/1998 | Kasamatsu | 455/126 |
| 5,883,541 A * | 3/1999 | Tahara et al. | 327/434 |
| 5,903,178 A * | 5/1999 | Miyatsuji et al. | 327/308 |
| 6,216,012 B1 | 4/2001 | Jensen | 455/553.1 |
| 6,229,370 B1 * | 5/2001 | Inamori et al. | 327/308 |
| 6,337,974 B1 * | 1/2002 | Inamori et al. | 455/126 |
| 6,448,866 B1 | 9/2002 | Watanabe | 333/8 R |
| 6,653,697 B2 * | 11/2003 | Hidaka et al. | 257/393 |
| 6,853,235 B2 * | 2/2005 | Nakayama et al. | 327/379 |
| 2002/0000866 A1 | 1/2002 | Weiss et al. | 327/494 |

FOREIGN PATENT DOCUMENTS

EP    0859464    8/1998

(Continued)

OTHER PUBLICATIONS

European Search Report dated Oct. 15, 2004.

(Continued)

*Primary Examiner*—Timothy P. Callahan
*Assistant Examiner*—Hai L. Nguyen
(74) *Attorney, Agent, or Firm*—Stevens, Davis, Miller & Mosher, LLP

(57) ABSTRACT

Provided are: at least one or more series variable resistors implemented by field effect transistors connected to a signal line A; and at least one or more shunt variable resistors implemented by field effect transistors connected between a signal outputting section A and a reference potential section GND. Further provided are: at least one or more series variable resistors implemented by field effect transistors connected to a signal line B arranged in parallel to the signal line A; and at least one or more shunt variable resistors implemented by field effect transistors connected between a signal outputting section B and a reference potential section GND.

35 Claims, 16 Drawing Sheets

FOREIGN PATENT DOCUMENTS

| | | |
|---|---|---|
| EP | 0859464 A2 | 8/1998 |
| EP | 0859464 A3 | 1/2000 |
| EP | 0993111 | 4/2000 |
| EP | 0993111 A1 | 4/2000 |
| EP | 1058405 | 12/2000 |
| EP | 1058405 A2 | 12/2000 |
| JP | 02039681 | 2/1990 |
| JP | 10051251 | 2/1998 |
| JP | 11186921 | 7/1999 |
| JP | 2000 077963 | 3/2000 |
| JP | 2000 124709 | 4/2000 |
| JP | 2000 341144 | 12/2000 |

OTHER PUBLICATIONS

Japanese Office Action dated Oct. 13, 2006 with English translation.
European Search Report dated Sep. 29, 2004.

* cited by examiner

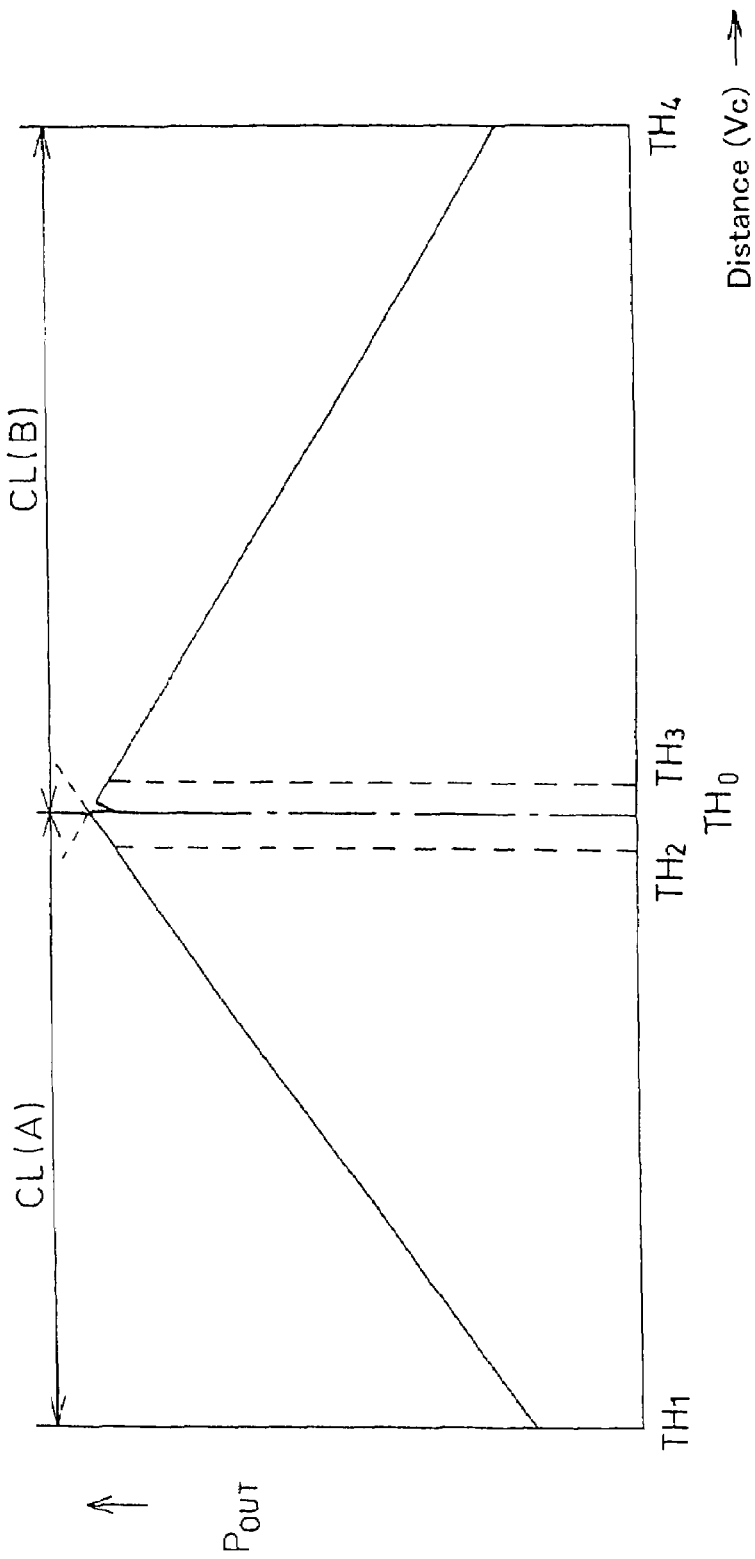

ATTENUATOR AND PORTABLE TELEPHONE TERMINAL APPARATUS USING THE SAME

BACKGROUND OF THE INVENTION

1. Field of the Invention

The present invention relates to a dual band (mode) portable telephone terminal apparatus and, in particular, to the configuration of an attenuator in a high frequency section inside a radio section of the apparatus. The attenuator according to the invention permits high quality speech through the portable telephone terminal apparatus, and hence is useful as an attenuator in a high frequency section inside a radio section of a dual band (mode) portable telephone terminal apparatus.

2. Related Art of the Invention

In a digital system (such as PDC), the intensity of radio waves delivered from a portable telephone terminal apparatus to abase station needs to be maintained at constant independently of the distance between the portable telephone terminal apparatus and the base station. For this purpose, gain control is performed in a transmitting section in the portable telephone terminal apparatus.

FIG. 9 schematically shows the positional relation between a base station and a portable telephone terminal apparatus. In FIG. 9, the cell region CL of a base station BS has a radius of approximately a few tens km (for example, approximately 30 km). Within the cell region CL of the base station BS, a large number of portable telephone terminal apparatuses $TH_1$ and $TH_2$ are present that have different distance from the base station BS or different communication conditions such as geography. Then, with varying the distance from the base station BS or the communication conditions moment by moment, a large number of these portable telephone terminal apparatuses $TH_1$ and $TH_2$ are simultaneously performing communication with the base station BS.

In such a case, in order that the intensity of the radio waves delivered from a portable telephone terminal apparatus to the base station is maintained to be the same for the nearest location and the farthest location relative to the base station BS within the cell region CL of the base station BS, the transmitting section of the portable telephone terminal apparatus requires a gain control range of approximately 50 dB or wider for the cell region CL of the above-mentioned size. This issue is called the far-near problem.

In case that the gain control is not satisfactorily performed in the transmitting section of the portable telephone terminal apparatus, when the distance of the portable telephone terminal apparatus from the base station decreases, the intensity of the radio waves delivered to the base station increases, and hence causes an increase in the leakage power to adjacent channels. This causes an increase in the code error rate, and hence degrades the speech quality. In FIG. 10, solid lines $A_1$–$A_6$ indicate the intensity of the radio waves of respective channels received at the base station, while a broken line $B_4$ indicates the intermodulation distortion characteristics of the channel $A_4$. FIG. 10 shows the situation that the intensity of the received radio waves of the channels $A_3$ and $A_5$ is buried in the distorted component of the channel $A_4$ indicated by the broken line $B_4$, so that the data is not correctly restored from the channels $A_3$ and $A_5$ adjacent to the channel $A_4$.

In order to maintain a high ratio (C/N) of the carrier signal level to the noise level, the gain control in the transmitting section of the portable telephone terminal apparatus is preferred to be carried out in the high frequency section where the carrier signal is at a high level. This is because in the high frequency section, the carrier signal is at a considerably higher level than the background noise, and hence even when the gain is reduced in the high frequency section, the level difference of the carrier signal from the noise is still maintained to be large. In contrast, when the gain is reduced in the intermediate frequency section where the carrier signal is at a low level, the level difference of the carrier signal from the background noise becomes very small, and this small level difference of the carrier signal from the noise in the intermediate frequency section appears directly in the high frequency section.

For the purpose of achieving such gain control in the range of 50 dB or wider in the transmitting section of the radio section of the portable telephone terminal apparatus, the gain is adjusted by continuous control in the high frequency section and by stepwise control in the intermediate frequency section. Such simultaneous use of the amount of gain control in the high frequency section and the amount of gain control in the intermediate frequency section permits the gain control in the range of 50 dB or wider.

In this situation, the gain control in the portable telephone terminal apparatus is performed as follows. That is, in the portable telephone terminal apparatus, a target value for the transmission power necessary for maintaining the intensity of the received signal at the base station to be constant is set on the basis of the intensity of the received signal at the portable telephone terminal apparatus. Then, a feedback loop is constructed that compares this target value with the actual transmission power so as to cause the transmission power to follow the target value. As such, the gain control is performed such that the transmission power agrees with the target value.

In a dual band (mode) portable telephone terminal apparatus, band (mode) switching is performed when the portable telephone terminal apparatus moves from the cell region CL(A) of a base station BS(A) using a band A (mode A) to the cell region CL(B) of a base station BS(B) using a band B (mode B) as shown in FIG. 11. Here, the bands A and B denote two distinct frequency bands used in the respective cell regions. The modes A and B indicate two distinct systems used there. In this situation, a portable telephone terminal apparatus is first located within the cell region CL(A), and gain control is performed such that the intensity of the radio waves delivered from the portable telephone terminal apparatus to the base station BS(A) is maintained at constant. Then, the portable telephone terminal apparatus moves from the cell region CL(A) into the cell region CL(B). At this instance, band (mode) switching is performed in the portable telephone terminal apparatus, and then gain control is performed such that the intensity of the radio waves delivered to the base station BS(B) is maintained at constant. Symbol $TH_0$ indicates the portable telephone terminal apparatus positioned at the boundary between the cell region CL(A) and the cell region CL(B). Symbols $TH_1$ and $TH_2$ indicate the portable telephone terminal apparatus positioned within the cell region CL(A). Here, the portable telephone terminal apparatus $TH_1$ is at a position near the base station BS(A), while the portable telephone terminal apparatus $TH_2$ is at a position far from the base station BS(A). Symbols $TH_3$ and $TH_4$ indicate the portable telephone terminal apparatus positioned within the cell region CL(B). Here, the portable telephone terminal apparatus $TH_4$ is at a position near the base station BS(B), while the portable telephone terminal apparatus $TH_3$ is at a position far from the base station BS(B).

The configuration and the operation of such a prior art portable telephone terminal apparatus is described below with reference to FIG. 12. As shown in FIG. 12, the portable telephone terminal apparatus is constructed from a microcomputer logic section or the like, and comprises; a baseband section 100 for processing a voice signal; and a radio section 200 for receiving the voice signal processed in the baseband section 100 and then performing communication with a base station.

The radio section 200 comprises: a transmitting section 210 for generating a transmission signal to be transmitted to the base station; and a receiving section 220 for receiving a transmission signal transmitted from the base station.

The transmitting section 210 comprises: an intermediate frequency section 230 for performing the modulation of the voice signal provided from the baseband section 100 and the mixing of the signals for the purpose of frequency conversion; and a high frequency section 240 for band A and a high frequency section 250 for band B, each for amplifying a high frequency signal outputted from the intermediate frequency section 230 and then providing the signal through a switch 310 to an antenna 300.

The intermediate frequency section 230 comprises: a modulator 231; a variable gain intermediate frequency amplifier 232 for amplifying at a variable gain the output signal of the modulator 231; and a mixer 233 for converting the output signal of the variable gain intermediate frequency amplifier 232 into a high frequency signal. The variable gain intermediate frequency amplifier 232 is constructed from a bipolar transistor in many cases. The gain of the variable gain intermediate frequency amplifier 232 can be adjusted discretely in several steps of 5–6 dB intervals. This gain is controlled stepwise in the range of 20 dB or the like by a discrete gain control voltage.

The high frequency section 240 comprises: a variable gain high frequency amplifier 241 for amplifying at a variable gain the high frequency signal of the band A outputted from the intermediate frequency section 230; and a power amplifier 242 for power-amplifying the output of the variable gain high frequency amplifier 241. The gain of the variable gain high frequency amplifier 241 can be adjusted in the range of 40 dB or the like. This gain is controlled continuously in the range of 30 dB or the like by a continuously varying gain control voltage.

The variable gain high frequency amplifier 241 comprises: a preamplifier (medium power amplifier) 244; and an attenuator 243 cascaded to the preamplifier 244 and thereby adjusting the gain for the high frequency signal of the band A to be inputted to the power amplifier (high power amplifier) 242. The attenuator 243 has the function of changing the amount of attenuation in the range of 40 dB or the like.

The high frequency section 250 comprises: a variable gain high frequency amplifier 251 for amplifying at a variable gain the high frequency signal of the band B outputted from the intermediate frequency section 230; and a power amplifier 252 for power-amplifying the output of the variable gain high frequency amplifier 251. The gain of the variable gain high frequency amplifier 251 can be adjusted in the range of 40 dB or the like. This gain is controlled continuously in the range of 30 dB or the like by a continuously varying gain control voltage.

The variable gain high frequency amplifier 251 comprises: a preamplifier (medium power amplifier) 254; and an attenuator 253 cascaded to the preamplifier 254 and thereby adjusting the gain for the high frequency signal of the band B to be inputted to the power amplifier (high power amplifier) 252. The attenuator 253 has the function of changing the amount of attenuation in the range of 40 dB or the like.

The baseband section 100 comprises a controlling section 110. On the basis of the received signal in the receiving section 220, the controlling section 110 determines the band to be used for the high frequency signal to be transmitted, and then applies a drain voltage VDD(A) and a drain voltage VDD(B) to the attenuator 243 and the attenuator 253 respectively, so as to perform band selection for the high frequency signal to be transmitted.

In the communication using the frequency band A, the controlling section 110 detects the signal intensity of the received signal of the receiving section 220, and detects the output level of the power amplifier 242. Then, depending on the signal intensity of the received signal, the controlling section 110 sets a target value for the output level of the power amplifier 242, and then compares the output level of the power amplifier 242 with the target value for the output level of the power amplifier 242, so as to apply again control voltage Vc(RF) corresponding to the comparison result onto the attenuator 243 and apply a gain control voltage Vc(IF) corresponding to the comparison result onto the variable gain intermediate frequency amplifier 232. As such, the amount of the attenuator 243 (the gain of the variable gain high frequency amplifier 241) and the gain of the variable gain intermediate frequency amplifier 232 are controlled and adjusted such that the output level of the power amplifier 242 follows and agrees with the target value for the output level of the power amplifier 242.

Further, in the communication using the frequency band B, the controlling section 110 detects the signal intensity of the received signal of the receiving section 220, and detects the output level of the power amplifier 252. Then, depending on the signal intensity of the received signal, the controlling section 110 sets a target value for the output level of the power amplifier 252, and then compares the output level of the power amplifier 252 with the target value for the output level of the power amplifier 252, so as to apply a gain control voltage Vc(RF) corresponding to the comparison result onto the attenuator 253 and apply a gain control voltage Vc(IF) corresponding to the comparison result onto the variable gain intermediate frequency amplifier 232. As such, the amount of the attenuator 253 (the gain of the variable gain high frequency amplifier 251) and the gain of the variable gain intermediate frequency amplifier 232 are controlled and adjusted such that the output level of the power amplifier 252 follows and agrees with the target value for the output level of the power amplifier 252.

In the portable telephone terminal apparatus described above, simultaneous use of the gain control of the variable gain high frequency amplifier 241 or the variable gain high frequency amplifier 251 and the gain control of the variable gain intermediate frequency amplifier 232 realizes the gain control in the range of 50 dB or wider. In the PDC standard, the input stage of the mixer 233 operates in a 200-MHz band, while the output stage of the mixer 233 operates in a 940-MHz band or a 1441-MHz band. Signal levels in various sections at the maximum output power of the portable telephone terminal are as follows. The output of the power amplifier 242 or the power amplifier 252 has a signal level of +30 dBm (where 0 dBm=1 mW). The output of the variable gain high frequency amplifier 241 or the variable gain high frequency amplifier 251 has a signal level of +8 dBm. The output of the attenuator 243 or the attenuator 253 has a signal level of −16 dBm. The output of the mixer 233 has a signal level of −15 dBm. The output of the variable gain intermediate frequency amplifier 232 has a signal level of −20 dBm.

In this situation, when the variable gain high frequency amplifier 241 performs gain control in the range of 30 dB, and when the variable gain intermediate frequency amplifier 232 performs gain control in the range of 20 dB, the signal level in the output of the variable gain intermediate frequency amplifier 232 varies in the range from −20 dBm to −40 dBm. The signal level in the output of the mixer 233 varies in the range from −15 dBm to −35 dBm. The signal level in the output of the attenuator 243 or the attenuator 253 varies in the range from −16 dBm to −46 dBm. The signal level in the output of the variable gain high frequency amplifier 241 or the variable gain high frequency amplifier 251 varies in the range from +8 dBm to −22 dBm. The signal level in the output of the power amplifier 242 or the power amplifier 252 varies in the range from +30 dBm to −20 dBm.

Examples of such a prior art attenuator include one described in U.S. Pat. No. 4,890,077 and the attenuator 243 (or the attenuator 253) shown in FIG. 13. The attenuator shown in FIG. 13 is different, in detail, from the prior art attenuator described in U.S. Pat. No. 4,890,077. However, in principle, the configuration and the operation of the former are similar to those of the latter.

Specific configuration of the attenuator 243 (or the attenuator 253) and its operation during band selection are described below with reference to FIGS. 13 and 14A–14C.

FIG. 13 is a circuit diagram showing the configuration of the attenuator 243. The attenuator 243 having such configuration performs the gain control. As shown in FIG. 13, the attenuator comprises: a field effect transistor 1 serving as a shunt variable resistor on the input side; a field effect transistor 9 serving as a shunt variable resistor on the output side; capacitors 2, 3, 10, and 11; resistors 5, 7, and 13; and a field effect transistor 6 serving as a series variable resistor.

The attenuator further comprises: a gain control voltage applying terminal 4 for applying the gain control voltage Vc(RF) therethrough; a source voltage applying terminal 8 for applying a supply voltage VDD therethrough; a gate voltage applying terminal 12 for applying a GND terminal voltage (reference potential) therethrough; an input terminal 14 serving as an inputting section for the high frequency signal; and an output terminal 15 serving as an outputting section for the high frequency signal. The input terminal 14 is connected to the output of the mixer 233 of FIG. 12, while the output terminal 15 is connected to the input of the preamplifier 244. The capacitors 2, 3, 10, and 11 block the application of a DC voltage, while the resistors 5, 7, and 13 block the entrance of the high frequency signal.

The attenuator 253 has a circuit configuration (not shown) similar to that of the attenuator 243. It should be noted that the attenuator 243 and the attenuator 253 are formed separately, and hence the field effect transistors incorporated in the attenuators 243 and 253 have certain variation in their characteristics such as the threshold voltage, in some cases.

FIGS. 14A, 14B, and 14C are voltage control characteristics diagrams shown as a function of the location of the attenuator 243 and the attenuator 253. FIG. 14A shows the characteristics of the attenuators 243 and 253 in an overlay manner. FIG. 14B shows the characteristics of the attenuator 243, while FIG. 14C shows the characteristics of the attenuator 253.

The threshold voltage of the series field effect transistor 6 used in the attenuator 243 for the cell region CL(A) is denoted by Vth_T_A, while the threshold voltage of the shunt field effect transistors 1 and 9 is denoted by Vth_S_A. Then, the following relation holds.

$Vth\_T\_A = Vth\_S\_A = -1.8$ V

When the supply voltage applied to the attenuator 243 is denoted by VDD_A, the following relation holds.

$VDD\_A = 2.9$ V

The gain control voltage that causes the series field effect transistor 6 to go completely off (pinch off) is defined as VcOFF_T_A, while the gain control voltage that causes the shunt field effect transistors 1 and 9 to go completely off (pinch off) is defined as VcOFF_S_A. Then, the following relation holds.

$Vth\_T\_A = VcOFF\_T\_A - VDD\_A$

Thus, the following relation is obtained.

$VcOFF\_T\_A = Vth\_T\_A + VDD\_A = 1.1$ V

Similarly, the following relation holds.

$Vth\_S\_A = 0$ V $- VcOFF\_S\_A$

Thus, the following relation is obtained (See FIG. 14B).

$VcOFF\_S\_A = -Vth\_S\_A = 1.8$ V

Similarly, the threshold voltage of the series field effect transistor used in the attenuator 253 for the cell region CL(B) is denoted by Vth_T_B, while the threshold voltage of the shunt field effect transistors is denoted by Vth_S_B. Then, the following relation holds.

$Vth\_T\_B = Vth\_S\_B = -1.6$ V

When the supply voltage applied to the attenuator 253 is denoted by VDD_B, the following relation holds.

$VDD\_B = 2.9$ V

The gain control voltage that causes the series field effect transistor to go completely off (pinch off) is defined as VcOFF_T_B, while the gain control voltage that causes the shunt field effect transistors to go completely off (pinch off) is defined as VcOFF_S_B. Then, the following relation holds.

$Vth\_T\_B = VcOFF\_T\_B - VDD\_B$

Thus, the following relation is obtained.

$VcOFF\_T\_B = Vth\_T\_B + VDD\_B = 1.3$ V

Similarly, the following relation holds.

$Vth\_S\_B = 0$ V $- VcOFF\_S\_B$

Thus, the following relation is obtained (See FIG. 14C).

$VcOFF\_S\_B = -Vth\_S\_B = 1.6$ V

FIG. 14A shows an overlay of the characteristics of FIG. 14B and the characteristics of FIG. 14C. In the figure, these attenuation characteristics (threshold values) do not agree with each other. Thus, when the band is switched at the time of move, for example, from the cell region CL(A) into the cell region CL(B), the gain control voltage Vc provided to the attenuator 253 needs to be simultaneously adjusted in order for the output of the attenuator 253 to be set at the same level as the output of the attenuator 243.

The slope of the change in the amount of attenuation is different in FIGS. 14B and 14C. This difference is caused mainly by a difference in the threshold value in the field effect transistors. The difference in the characteristics can be caused also by a variation in the on-resistance in the field effect transistors and by a variation in their parasitic capacitance.

The operation of the attenuator having such configuration is described below. Here, the portable telephone terminal apparatus is driven by a lithium battery or the like at a voltage up to 3.0 V or the like. The threshold voltage of the field effect transistor indicates a bias voltage that causes the variable resistor to begin gain control operation. A ground voltage (reference voltage) is applied to the gate voltage applying terminals 12 of the field effect transistors 1 and 9.

Within the cell region CL(A) where the band A is used, a voltage of 2.9 V is applied to the drain voltage applying terminal 8 of the attenuator 243 in order to select the band A, while a voltage of 0 V is applied to the drain voltage applying terminal 8 of the attenuator 253 in order not to select the band B. When the portable telephone terminal apparatus is located at the position TH1, the distance is the shortest between the portable telephone terminal apparatus and the base station BS(A) within the cell region CL(A). Thus, in order to maximize the amount of attenuation in the attenuator 243, a gain control voltage Vc(RF) of the minimum value (1.1 V) is applied to the gain control voltage applying terminal 4.

Then, with the move of the portable telephone terminal apparatus from the position TH1 to the position TH0, in order to adjust the amount of attenuation of the attenuator 243 from the maximum value to the minimum value, the gain control voltage Vc(RF) applied to the gain control voltage applying terminal 4 is adjusted gradually from the minimum value (1.1 V) to the maximum value (1.8 V).

At the same time when the portable telephone terminal apparatus reaches the position TH0, within the cell region CL(B) where the band B is used, a voltage of 2.9 V is applied to the drain voltage applying terminal 8 of the attenuator 253 in order to select the band B, while a voltage of 0 V is applied to the drain voltage applying terminal 8 of the attenuator 243 in order not to select the band A. At that time, the distance of the portable telephone terminal apparatus (TH0) is the farthest from the base station BS(B) within the cell region CL(B). Thus, in order to minimize the amount of attenuation in the attenuator 253, a gain control voltage Vc(RF) of the maximum value (1.6 V) is applied to the gain control voltage applying terminal 4.

Further, with the move of the portable telephone terminal apparatus from the position TH0 to the position TH4, in order to adjust the amount of attenuation of the attenuator 253 from the minimum value to the maximum value, the gain control voltage Vc(RF) applied to the gain control voltage applying terminal 4 is adjusted gradually from the maximum value (1.6 V) to the minimum value (1.3 V).

On the other hand, in the variable gain intermediate frequency amplifier 232, the output level is adjusted stepwise by changing the gain control voltage Vc(IF) regardless of the selection of the band A or B.

Nevertheless, when the switching from the band A to the band B is performed by the combination of the attenuator 243 and the attenuator 253 fabricated separately, the difference between the threshold voltage (−1.8 V) of the field effect transistors 1, 9, and 6 incorporated in the attenuator 243 and the threshold voltage (−1.6 V) of the field effect transistors 1, 9, and 6 incorporated in the attenuator 253 causes a difference between the gain control characteristics (of the attenuator 243) within the cell region CL(A) and the gain control characteristics (of the attenuator 253) within the cell region CL(B) as shown in FIGS. 14A, 14B, and 14C. In particular, at the time of band selection (at the position TH0), the difference between the gain control voltage (1.8 V) for minimizing the amount of attenuation of the attenuator 243 and the gain control voltage (1.6V) for minimizing the amount of attenuation of the attenuator 253 causes the necessity of a certain time (a few tens μsec or more) for adjusting the gain control voltage into the desired value. In addition, a few tens μsec or the like is necessary from the application of the drain voltage VDD(B) to the achievement of stability in the attenuator 253. Thus, the gain control voltage Vc(RF) applied to the gain control voltage applying terminal 4 of the attenuator 253 delays for this transient response time of the attenuator 253. As a result, a variation in the characteristics of the attenuator 253 and the variable gain intermediate frequency amplifier 232 can cause a difference in the desired gain of the portable telephone terminal apparatus immediately after the band selection.

In such a case, when the portable telephone terminal apparatus is performing communication with moving away from the base station at a constant velocity under ideal conditions, the output $P_{out}$ of the portable telephone terminal apparatus normally decrease linearly within the cell region CL(B) by virtue of the gain control function, as shown in FIG. 15. Nevertheless, at the time of band selection, the output $P_{out}$ of the portable telephone terminal apparatus temporarily deviates from the line at the time of band selection because of the delay in the follow operation caused by the time delay in the feedback control and because of the discontinuity in the output level at the band selection. At that time, the intensity of the received signal in the base station deviates from a normal value, so that a level difference occurs relative to the adjacent channel. This has caused the problem of voice disturbance and hence of degradation in the voice quality. This problem has been described for the case that the portable telephone terminal apparatus moves under ideal conditions. Nevertheless, actual conditions during the move are more adverse. For example, the portable telephone terminal apparatus can enter behind a building, so that the intensity of the received signal can decrease suddenly. Thus, the above-mentioned problem should occur frequently that the intensity of the received signal in the base station deviates from a normal value so that the voice quality degrades.

Further, the controlling section 110 of the baseband section 100 needs two kinds of voltage setting corresponding to the two values for the drain voltage VDD(A) and the drain voltage VDD(B) used for the control of the selection and the non-selection of the variable gain high frequency amplifier 241 and the variable gain high frequency amplifier 251. This causes complexity in the control in the controlling section 110.

Furthermore, the high frequency transmitting section 210 needs both the variable gain high frequency amplifier 241 comprising the attenuator 243 and the variable gain high frequency amplifier 251 comprising the attenuator 253. This causes complexity in the circuit configuration, as well as an increase in space requirement. This has caused the problem of an increase in the overall size of the portable telephone terminal apparatus.

SUMMARY OF THE INVENTION

An object of the invention is to provide an attenuator capable of realizing high quality speech in a portable telephone terminal apparatus.

Another object of the invention is to provide an attenuator capable of simplifying the control of band selection in a portable telephone terminal apparatus.

Yet another object of the invention is to provide an attenuator capable of reducing the space requirement and hence the size in a portable telephone terminal apparatus.

Further, an object of the invention is to provide a portable telephone terminal apparatus capable of performing high quality speech.

Another object of the invention is to provide a portable telephone terminal apparatus capable of simplifying the control of band selection.

Yet another object of the invention is to provide a portable telephone terminal apparatus capable of reducing the space requirement and hence the size.

An attenuator according to the invention comprises: a first signal line including a first variable resistor connecting a first signal inputting section for high frequency signal to a first signal outputting section; a second signal line including a second variable resistor connecting a second signal inputting section for high frequency signal to a second signal outputting section, the second signal line being arranged in parallel to the first signal line; reference voltage applying sections connected to the first variable resistor and the second variable resistor; and a gain control voltage applying section connected to the first variable resistor and the second variable resistor; wherein the attenuation characteristics of the first variable resistor and the second variable resistor and the voltage applied to the reference voltage applying sections are set such that the change of the amount of attenuation relative to the change in the gain control voltage becomes the same for the first variable resistor and the second variable resistor. Two signal lines (the first and the second ones) are used in this configuration. However, three or more signal lines may be used.

The above-mentioned first variable resistor is composed for example of a third variable resistor connecting the first signal inputting section to the first signal outputting section and of a fourth variable resistor connecting any one of the first signal inputting section and the first signal outputting section to a reference potential section. The second variable resistor is composed of a fifth variable resistor connecting the second signal inputting section to the second signal outputting section and of a sixth variable resistor connecting any one of the second signal inputting section and the second signal outputting section to the reference potential section. The reference voltage applying sections are composed of a first reference voltage applying section and a second reference voltage applying section. The third variable resistor and the fifth variable resistor are connected to the first reference voltage applying section, while the fourth variable resistor and the sixth variable resistor are connected to the second reference voltage applying section, and while each of the third variable resistor, the fourth variable resistor, the fifth variable resistor, and the sixth variable resistor is connected to the gain control voltage applying section.

The above-mentioned third, fourth, fifth, and sixth variable resistors have, for example, such configuration that at least first, second, third, and fourth resistors are respectively connected to the gates of first, second, third, and fourth field effect transistors. The variable resistor may be constructed from a series circuit of two or more field effect transistors. The situation is the same even when the invention is applied to a portable telephone terminal apparatus.

The gates of the first and third field effect transistors respectively constituting the third variable resistor and the fifth variable resistor are respectively connected through the first and third resistors to the gain control voltage applying section. The sources of the second and fourth field effect transistors respectively constituting the fourth variable resistor and the sixth variable resistor are connected to the gain control voltage applying section. The sources of the first and third field effect transistors respectively constituting the third variable resistor and the fifth variable resistor are respectively connected through fifth and sixth resistors to the first reference voltage applying section. The gates of the second and fourth field effect transistors respectively constituting the fourth variable resistor and the sixth variable resistor are respectively connected through the second and fourth resistors to the second reference voltage applying section. The drains of the second and fourth field effect transistors respectively constituting the fourth variable resistor and the sixth variable resistor are respectively connected through first and second capacitors to the first signal outputting section and the second signal outputting section. The sources of the second and fourth field effect transistors respectively constituting the fourth variable resistor and the sixth variable resistor are respectively connected through third and fourth capacitors to the reference potential section. The second signal line including the third variable resistor and the second signal line including the fifth variable resistor are connected in parallel to each other.

Here, it is preferable that the voltage applied to the second reference voltage applying section is lower than the voltage applied to the first reference voltage applying section.

It is preferable that the voltage applied to the second reference voltage applying section is set at a value which is lower than the voltage applied to the first reference voltage applying section and which is equal to the gain control voltage that causes the first and third field effect transistors respectively constituting the third variable resistor and the fifth variable resistor to go completely off plus the gain control voltage that causes the second and fourth field effect transistors respectively constituting the fourth variable resistor and the sixth variable resistor to go completely off minus the voltage applied to the first reference voltage applying section.

It is preferable that the voltage values applied to the first reference voltage applying section and the second reference voltage applying section are set such that the gain control voltage range where the first variable resistor performs gain control operation agrees with the gain control voltage range where the second variable resistor performs gain control operation.

It is preferable that the voltage values applied to the first reference voltage applying section and the second reference voltage applying section are set such that the gain control voltage range where the third variable resistor performs gain control operation agrees with the gain control voltage range where the fifth variable resistor performs gain control operation, and such that the gain control voltage range where the fourth variable resistor performs gain control operation agrees with the gain control voltage range where the sixth variable resistor performs gain control operation.

It is preferable that the voltage values applied to the first reference voltage applying section and the second reference voltage applying section are set such that the gain control voltage that causes the first field effect transistor constituting the third variable resistor to go completely off agrees with the gain control voltage that causes the third field effect transistor constituting the fifth variable resistor to go completely off, and such that the gain control voltage that causes the second field effect transistor constituting the fourth variable resistor to go completely off agrees with the gain control voltage that causes the fourth field effect transistor constituting the sixth variable resistor to go completely off.

It is preferable that the voltage values applied to the first reference voltage applying section and the second reference voltage applying section are set such that the gain control voltage range where the fourth variable resistor and the sixth variable resistor perform gain control operation is higher than the gain control voltage range where the third variable resistor and the fifth variable resistor perform gain control operation.

It is preferable that the voltage values applied to the first reference voltage applying section and the second reference voltage applying section are set such that the gain control voltage that causes the second and fourth field effect transistors respectively constituting the fourth variable resistor and the sixth variable resistor to go completely off is higher than the gain control voltage that causes the first and third field effect transistors respectively constituting the third variable resistor and the fifth variable resistor to go completely off.

In such configuration described above, it is preferable that the threshold voltage of the second and fourth field effect transistors respectively constituting the fourth variable resistor and the sixth variable resistor is higher than the threshold voltage of the first and third field effect transistors respectively constituting the third variable resistor and the fifth variable resistor.

It is preferable that the threshold voltage of the first and third field effect transistors respectively constituting the third variable resistor and the fifth variable resistor and the threshold voltage of the second and fourth field effect transistors respectively constituting the fourth variable resistor and the sixth variable resistor are set such that the gain control voltage range where the first variable resistor performs gain control operation agrees with the gain control voltage range where the second variable resistor performs gain control operation.

It is preferable that the threshold voltage of the first and third field effect transistors respectively constituting the third variable resistor and the fifth variable resistor and the threshold voltage of the second and fourth field effect transistors respectively constituting the fourth variable resistor and the sixth variable resistor are set such that the gain control voltage range where the third variable resistor performs gain control operation agrees with the gain control voltage range where the fifth variable resistor performs gain control operation, and such that the gain control voltage range where the fourth variable resistor performs gain control operation agrees with the gain control voltage range where the sixth variable resistor performs gain control operation.

It is preferable that the threshold voltage of the first and third field effect transistors respectively constituting the third variable resistor and the fifth variable resistor and the threshold voltage of the second and fourth field effect transistors respectively constituting the fourth variable resistor and the sixth variable resistor are set such that the gain control voltage that causes the first field effect transistor constituting the third variable resistor to go completely off agrees with the gain control voltage that causes the third field effect transistor constituting the fifth variable resistor to go completely off, and such that the gain control voltage that causes the second field effect transistor constituting the fourth variable resistor to go completely off agrees with the gain control voltage that causes the fourth field effect transistor constituting the sixth variable resistor to go completely off.

It is preferable that the threshold voltage of the first and third field effect transistors respectively constituting the third variable resistor and the fifth variable resistor and the threshold voltage of the second and fourth field effect transistors respectively constituting the fourth variable resistor and the sixth variable resistor are set such that the operation is performed in a state that the gain control voltage range where the fourth variable resistor and the sixth variable resistor perform gain control operation is higher than the gain control voltage range where the third variable resistor and the fifth variable resistor perform gain control operation.

It is preferable that the threshold voltage of the first and third field effect transistors respectively constituting the third variable resistor and the fifth variable resistor and the threshold voltage of the second and fourth field effect transistors respectively constituting the fourth variable resistor and the sixth variable resistor are set such that the operation is performed in a state that the gain control voltage that causes the second and fourth field effect transistors respectively constituting the fourth variable resistor and the sixth variable resistor to go completely off is higher than the gain control voltage that causes the first and third field effect transistors respectively constituting the third variable resistor and the fifth variable resistor to go completely off.

Another example of configuration of the first and second variable resistors is as follows. That is, the first variable resistor is composed of a third variable resistor connecting the first signal inputting section to the first signal outputting section and of a fourth variable resistor connecting any one of the first signal inputting section and the first signal outputting section to a reference potential section. Further, the second variable resistor is composed of a fifth variable resistor connecting the second signal inputting section to the second signal outputting section and of a sixth variable resistor connecting any one of the second signal inputting section and the second signal outputting section to the reference potential section. Furthermore, the third variable resistor, the fourth variable resistor, the fifth variable resistor, and the sixth variable resistor are connected to the first reference voltage applying section, while each of the third variable resistor, the fourth variable resistor, the fifth variable resistor, and the sixth variable resistor is connected to the gain control voltage applying section.

In this configuration, the third through sixth variable resistors have, for example, the following configuration.

That is, the above-mentioned third, fourth, fifth, and sixth variable resistors have such configuration that at least first, second, third, and fourth resistors are respectively connected to the gates of first, second, third, and fourth field effect transistors. The gates of the first and third field effect transistors respectively constituting the third variable resistor and the fifth variable resistor are respectively connected through the first and third resistors to the gain control voltage applying section. The sources of the second and fourth field effect transistors respectively constituting the fourth variable resistor and the sixth variable resistor are connected to the gain control voltage applying section. A first section to which the sources of the first and third field effect transistors respectively constituting the third variable resistor and the fifth variable resistor are respectively connected via the fifth and sixth resistors and is connected directly to the first reference voltage applying section. A seventh resistor is inserted and connected between the first section to which the sources of the first and third field effect transistors respectively constituting the third variable resistor and the fifth variable resistor are respectively connected via the fifth and sixth resistors and a second section which is respectively connected through the second and fourth resistors to the gates of the second and fourth field effect transistors respectively constituting the fourth variable resistor and the sixth variable resistor. An eighth resistor is inserted and connected between the second section which is respectively connected through the second and fourth resistors to the gates of the second and fourth field effect transistors respectively constituting the fourth variable resistor and the sixth variable resistor and the reference potential section. The drains of the second and fourth field effect transistors respectively constituting the fourth variable resistor and the sixth variable resistor are respectively connected through first and second capacitors to the first signal outputting section and the second signal outputting section. The sources of the second and fourth field effect transistors respectively constituting the fourth variable resistor and the sixth variable resistor are respectively connected through third and fourth capacitors to the reference potential section. The first signal line including the third variable resistor and the second signal line including the fifth variable resistor are connected in parallel to each other.

Another example of the configuration is as follows.

That is, the above-mentioned third, fourth, fifth, and sixth variable resistors have such configuration that at least first, second, third, and fourth resistors are respectively connected to the gates of first, second, third, and fourth field effect transistors. The gates of the first and third field effect transistors respectively constituting the third variable resistor and the fifth variable resistor are respectively connected through the first and third resistors to the gain control voltage applying section. The sources of the second and fourth field effect transistors respectively constituting the fourth variable resistor and the sixth variable resistor are connected to the gain control voltage applying section. The sources of the first and third field effect transistors respectively constituting the third variable resistor and the fifth variable resistor are respectively connected through fifth and sixth resistors to the reference voltage applying section. The gates of the second and fourth field effect transistors respectively constituting the fourth variable resistor and the sixth variable resistor are respectively connected through the second and fourth resistors to the reference voltage applying section. The drains of the second and fourth field effect transistors respectively constituting the fourth variable resistor and the sixth variable resistor are respectively connected through first and second capacitors to the first signal outputting section and the second signal outputting section. The sources of the second and fourth field effect transistors respectively constituting the fourth variable resistor and the sixth variable resistor are respectively connected through third and fourth capacitors to the reference potential section. The first signal line including the third variable resistor and the second signal line including the fifth variable resistor are connected in parallel to each other.

The reference voltage applying section may be common to the reference potential section.

A portable telephone terminal apparatus using the above-mentioned attenuator is described below.

The portable telephone terminal apparatus comprises a baseband section for processing a voice signal and a radio section for receiving the voice signal processed in the baseband section and for performing communication with a base station. Further, the radio section comprises a transmitting section for generating a transmission signal to be transmitted to the base station and a receiving section for receiving a transmission signal transmitted from the base station; the transmitting section comprises an intermediate frequency section for performing the modulation of the voice signal provided from the baseband section, the control of the gain for an intermediate frequency signal, and the mixing of the signals for the purpose of frequency conversion, and a high frequency section for amplifying a high frequency signal outputted from the intermediate frequency section and then providing the signal to an antenna; and the high frequency section comprises a gain controller for controlling the gain of at least two or more bands of high frequency signals outputted from the intermediate frequency section and for outputting selectively at least two or more bands, and a first power amplifier and a second power amplifier for selectively power-amplifying at least two or more outputs provided from the gain controller.

The baseband section comprises a controlling section; and the controlling section detects the signal information of a reception signal of the receiving section, then provides a gain control voltage corresponding to the information onto the gain controller, so as to switch the output of the first power amplifier into the output of the second power amplifier, then sets a target value for the output level of the second power amplifier in correspondence to the signal information of the reception signal, then compares the output level of the second power amplifier with the target value for the output level of the second power amplifier, and then provides a gain control voltage corresponding to the comparison result onto the gain controller and a variable gain intermediate frequency amplifier, so as to perform the follow control for the gain of the gain controller and the variable gain intermediate frequency amplifier such that the output level of the second power amplifier agrees with the target value for the output level of the second power amplifier.

The gain controller comprises: a first signal line including a first variable resistor connecting a first signal inputting section for high frequency signal to a first signal outputting section; a second signal line including a second variable resistor connecting a second signal inputting section for high frequency signal to a second signal outputting section, the second signal line being arranged in a number of at least one and in parallel to the first signal line; first reference voltage applying sections connected to each of the first variable resistor and the second variable resistor; and a gain control voltage applying section connected to each of the first variable resistor and the second variable resistor so as to allow a gain control voltage to be provided; where the attenuation characteristics of the first variable resistor and the second variable resistor and the voltage applied to the reference voltage applying sections are set such that the change of the amount of attenuation relative to the change in the gain control voltage becomes the same for the first variable resistor and the second variable resistor.

In this configuration, the first variable resistor is composed for example of a third variable resistor connecting the first signal inputting section to the first signal outputting section and of a fourth variable resistor connecting any one of the first signal inputting section and the first signal outputting section to a reference potential section. The second variable resistor is composed for example of a fifth variable resistor connecting the second signal inputting section to the second signal outputting section and of a sixth variable resistor connecting any one of the second signal inputting section and the second signal outputting section to the reference potential section. The reference voltage applying sections are composed for example of a first reference voltage applying section and a second reference voltage applying section.

Then, the third variable resistor and the fifth variable resistor are connected to the first reference voltage applying section, while the fourth variable resistor and the sixth variable resistor are connected to the second reference voltage applying section, and while each of the third variable resistor, the fourth variable resistor, the fifth variable resistor, and the sixth variable resistor is connected to the gain control voltage applying section.

Further, the above-mentioned third, fourth, fifth, and sixth variable resistors have such configuration that at least first, second, third, and fourth resistors are respectively connected to the gates of first, second, third, and fourth field effect transistors. The gates of the first and third field effect transistors respectively constituting the third variable resistor and the fifth variable resistor are respectively connected through the first and third resistors to the gain control voltage applying section. The sources of the second and fourth field effect transistors respectively constituting the fourth variable resistor and the sixth variable resistor are connected to the gain control voltage applying section. The sources of the first and third field effect transistors respectively constituting the third variable resistor and the fifth variable resistor are respectively connected through fifth and sixth resistors to the first reference voltage applying section. The gates of the second and fourth field effect transistors respectively constituting the fourth variable resistor and the sixth variable resistor are respectively connected through the second and fourth resistors to the second reference voltage applying section. The drains of the second and fourth field effect transistors respectively constituting the fourth variable resistor and the sixth variable resistor are respectively connected through first and second capacitors to the first signal outputting section and the second signal outputting section. The sources of the second and fourth field effect transistors respectively constituting the fourth variable resistor and the sixth variable resistor are respectively connected through third and fourth capacitors to the reference potential section. The first signal line including the third variable resistor and the second signal line including the fifth variable resistor are connected in parallel to each other.

Here, it is preferable that the voltage applied to the second reference voltage applying section is lower than the voltage applied to the first reference voltage applying section.

It is preferable that the voltage applied to the second reference voltage applying section is set at a value which is lower than the voltage applied to the first reference voltage applying section and which is equal to the gain control voltage that causes the first and third field effect transistors respectively constituting the third variable resistor and the fifth variable resistor to go completely off plus the gain control voltage that causes the second and fourth field effect transistors respectively constituting the fourth variable resistor and the sixth variable resistor to go completely off minus the voltage applied to the first reference voltage applying section.

It is preferable that the voltage values applied to the first reference voltage applying section and the second reference voltage applying section are set such that the gain control voltage range where the first variable resistor performs gain control operation agrees with the gain control voltage range where the second variable resistor performs gain control operation.

It is preferable that the voltage values applied to the first reference voltage applying section and the second reference voltage applying section are set such that the gain control voltage range where the third variable resistor performs gain control operation agrees with the gain control voltage range where the fifth variable resistor performs gain control operation, and such that the gain control voltage range where the fourth variable resistor performs gain control operation agrees with the gain control voltage range where the sixth variable resistor performs gain control operation.

It is preferable that the voltage values applied to the first reference voltage applying section and the second reference voltage applying section are set such that the gain control voltage that causes the first field effect transistor constituting the third variable resistor to go completely off agrees with the gain control voltage that causes the third field effect transistor constituting the fifth variable resistor to go completely off, and such that the gain control voltage that causes the second field effect transistor constituting the fourth variable resistor to go completely off agrees with the gain control voltage that causes the fourth field effect transistor constituting the sixth variable resistor to go completely off.

It is preferable that the voltage values applied to the first reference voltage applying section and the second reference voltage applying section are set such that the gain control voltage range where the fourth variable resistor and the sixth variable resistor perform gain control operation is higher than the gain control voltage range where the third variable resistor and the fifth variable resistor perform gain control operation.

It is preferable that the voltage values applied to the first reference voltage applying section and the second reference voltage applying section are set such that the gain control voltage that causes the second and fourth field effect transistors respectively constituting the fourth variable resistor and the sixth variable resistor to go completely off is higher than the gain control voltage that causes the first and third field effect transistors respectively constituting the third variable resistor and the fifth variable resistor to go completely off.

In such configuration described above, it is preferable that the threshold voltage of the second and fourth field effect transistors respectively constituting the fourth variable resistor and the sixth variable resistor is higher than the threshold voltage of the first and third field effect transistors respectively constituting the third variable resistor and the fifth variable resistor.

It is preferable that the threshold voltage of the first and third field effect transistors respectively constituting the third variable resistor and the fifth variable resistor and the threshold voltage of the second and fourth field effect transistors respectively constituting the fourth variable resistor and the sixth variable resistor are set such that the gain control voltage range where the first variable resistor performs gain control operation agrees with the gain control voltage range where the second variable resistor performs gain control operation.

It is preferable that the threshold voltage of the first and third field effect transistors respectively constituting the third variable resistor and the fifth variable resistor and the threshold voltage of the second and fourth field effect transistors respectively constituting the fourth variable resistor and the sixth variable resistor are set such that the gain control voltage range where the third variable resistor performs gain control operation agrees with the gain control voltage range where the fifth variable resistor performs gain control operation, and such that the gain control voltage range where the fourth variable resistor performs gain control operation agrees with the gain control voltage range where the sixth variable resistor performs gain control operation.

It is preferable that the threshold voltage of the first and third field effect transistors respectively constituting the third variable resistor and the fifth variable resistor and the threshold voltage of the second and fourth field effect transistors respectively constituting the fourth variable resistor and the sixth variable resistor are set such that the gain control voltage that causes the first field effect transistor constituting the third variable resistor to go completely off agrees with the gain control voltage that causes the third field effect transistor constituting the fifth variable resistor to go completely off, and such that the gain control voltage that causes the second field effect transistor constituting the fourth variable resistor to go completely off agrees with the gain control voltage that causes the fourth field effect transistor constituting the sixth variable resistor to go completely off.

It is preferable that the threshold voltage of the first and third field effect transistors respectively constituting the third variable resistor and the fifth variable resistor and the threshold voltage of the second and fourth field effect transistors respectively constituting the fourth variable resistor and the sixth variable resistor are set such that the operation is performed in a state that the gain control voltage range where the fourth variable resistor and the sixth variable resistor perform gain control operation is higher than the gain control voltage range where the third variable resistor and the fifth variable resistor perform gain control operation.

It is preferable that the threshold voltage of the first and third field effect transistors respectively constituting the third variable resistor and the fifth variable resistor and the threshold voltage of the second and fourth field effect transistors respectively constituting the fourth variable resistor and the sixth variable resistor are set such that the operation is performed in a state that the gain control voltage that causes the second and fourth field effect transistors respectively constituting the fourth variable resistor and the sixth variable resistor to go completely off is higher than the gain control voltage that causes the first and third field effect transistors respectively constituting the third variable resistor and the fifth variable resistor to go completely off.

As described above, in a portable telephone terminal apparatus according to the invention, an attenuator comprises: at least one or more series variable resistors implemented by field effect transistors or the like inserted in a first signal line connecting a first signal inputting section for high frequency signal to a first signal outputting section; at least one or more shunt variable resistors implemented by field effect transistors or the like inserted between the first signal outputting section and a reference voltage section (GND); at least one or more series variable resistors implemented by field effect transistors or the like inserted in a second signal line which is provided in parallel to the first signal line and which connects a second signal inputting section for high frequency signal to a second signal outputting section; and at least one or more shunt variable resistors implemented by field effect transistors or the like inserted between the second signal outputting section and the reference voltage section (GND); so that a gain control voltage applied to a gain control voltage applying section controls the amount of attenuation in each variable resistor. As such, the attenuator controls continuously the signal level of each band.

According to this configuration, the attenuator used comprises: at least one or more series variable resistors implemented by field effect transistors connected to the first signal line; and at least one or more shunt variable resistors implemented by field effect transistors connected between the first signal outputting section and the reference voltage section (GND). The attenuator further comprises: at least one or more series variable resistors implemented by field effect transistors connected to the second signal line provided in parallel to the first signal line; and at least one or more shunt variable resistors implemented by field effect transistors connected between the second signal outputting section and the reference voltage section (GND). Then, regardless of band selection, the variable resistors of respective bands perform similar gain control operation on the basis of the same gain control voltage, so that the variable resistor of the selected band substantially continuously controls the output of a power amplifier. This avoids the necessity of the adjustment of the gain control voltage at the time of band selection, and hence resolves the problem of delay caused by the transient response time in the drain voltage applied to each attenuator (subunit). This avoids the problem that the output of the portable telephone terminal apparatus temporarily deviates from the desired line at the time of band selection because of a delay in the follow operation caused by the time delay in the feedback control and because of a discontinuity in the output level at the band selection. Thus, high quality speech is achieved. Further, in the band selection in the high frequency section, the drain voltage need not be set for each attenuator (subunit), and hence it is sufficient to merely cause selectively each preamplifier and each power amplifier to perform amplification and output. This simplifies the control of band selection. Further, the high frequency section does not need attenuators for respective bands. This reduces space requirement and the size.

In a portable telephone terminal apparatus according to the invention, an attenuator comprises: at least one or more series variable resistors implemented by field effect transistors or the like inserted in a first signal line connecting a first signal inputting section for high frequency signal to a first signal outputting section; at least one or more shunt variable resistors implemented by field effect transistors or the like inserted between the first signal outputting section and a reference voltage section (GND); at least one or more series variable resistors implemented by field effect transistors or the like inserted in a second signal line which is provided in parallel to the first signal line and which connects a second signal inputting section for high frequency signal to a second signal outputting section; and at least one or more shunt variable resistors implemented by field effect transistors or the like inserted between the second signal outputting section and the reference voltage section (GND).

According to this configuration, the attenuator used comprises: at least one or more series variable resistors implemented by field effect transistors connected to the first signal line; and at least one or more shunt variable resistors implemented by field effect transistors connected between the first signal outputting section and the reference voltage section (GND). The attenuator further comprises: at least one or more series variable resistors implemented by field effect transistors connected to the second signal line provided in parallel to the first signal line; and at least one or more shunt variable resistors implemented by field effect transistors connected between the second signal outputting section and the reference voltage section (GND). Then, the operation range of the at least one or more series variable resistors implemented by field effect transistors connected to the first signal line is set the same as that of the at least one or more series variable resistors implemented by field effect transistors connected to the second signal line. Further, the operation range of the at least one or more shunt variable resistors implemented by field effect transistors connected between the second signal outputting section and the reference voltage section (GND) is set the same as that of the at least one or more shunt variable resistors implemented by field effect transistors connected between the first signal outputting section and the reference voltage section (GND). As such, the gain control operation range in the cell region CL(A) is set substantially continuous to that in the cell region CL(B). This permits the gain control in each band selection to be performed by a single and hence the same gain control voltage. This avoids a difference in the gain during the band selection, and hence permits gain control operation with extremely high accuracy.

As a result, in a portable telephone terminal apparatus provided with the above-mentioned attenuator, regardless of band selection, the variable resistors of respective bands perform similar gain control operation on the basis of the same gain control voltage, so that the variable resistor of the selected band substantially continuously controls the output of a power amplifier. This avoids the necessity of the adjustment of the gain control voltage at the time of band selection, and hence resolves the problem of delay caused by the transient response time in the drain voltage applied to each attenuator (subunit) This avoids the problem that the output of the portable telephone terminal apparatus temporarily deviates from the desired line at the time of band selection because of a delay in the follow operation caused by the time delay in the feedback control and because of a discontinuity in the output level at the band selection. Thus, high quality speech is achieved. Further, in the band selection in the high frequency section, the drain voltage need not be set for each attenuator (subunit), and hence it is sufficient to merely cause selectively each preamplifier and each power amplifier to perform amplification and output. This simplifies the control of band selection. Further, the high frequency section does not need attenuators for respective bands. This reduces space requirement and the size.

An example of configuration for causing the gain control operation range in the cell region CL(A) to be set the same as that in the cell region CL(B) is as follows. That is, the same gain control voltage is applied to the source electrodes of the at least one or more field effect transistors connected in series on one side and to the source electrodes of the at least one or more field effect transistors connected in series on the other side, while the same reference voltage is applied to the gate electrodes of the at least one or more field effect transistors connected in shunt on one side and to the gate electrodes of the at least one or more field effect transistors connected in shunt on the other side. This configuration permits the gain control to be performed by a single and the same gain control voltage and a single and the same reference voltage. This permits the portable telephone terminal apparatus to perform band selection and gain control with extremely high accuracy. Further, this configuration permits that the setting of the gain control operation voltage is changed arbitrarily.

Another example of the configuration is as follows. That is, the threshold voltage of the series field effect transistors on one side and the series field effect transistors on the other side may be set different from that of the shunt field effect transistors on one side and the shunt field effect transistors on the other side. This configuration permits the gain control to be performed by a single and the same gain control voltage and a single and the same reference voltage. This permits the portable telephone terminal apparatus to perform band selection and gain control with extremely high accuracy.

The difference of the invention from the prior art is described below. In the prior art, the selection of the band for a high frequency signal to be transmitted is performed by applying a drain voltage VDD(A) or a drain voltage VDD (B) to the attenuator 243 or the attenuator 253 of the band A or B and by applying a battery supply voltage or the like to the amplifiers 242 and 244 or the amplifiers 252 and 254. In this case, the switching between the two kinds of voltages of VDD(A) and VDD(B) is necessary, and hence causes complexity in the control. Further, this can cause the problem of a delay in the adjustment into the desired power during the band switching, which is caused for example by a deviation in the timing of switching.

According to the invention, a single reference voltage Vref in place of the voltages VDD(A) and VDD(B) is applied to the attenuator 277 (272A and 272B). Further, a battery supply voltage or the like is applied selectively to the amplifiers 242 and 244 or the amplifiers 252 and 254, so that band selection is performed. In this case, the attenuator 272 does not perform band selection. However, gain control is performed using a single gain control voltage and a single reference voltage. This avoids the necessity of the control of the voltages VDD(A) and VDD(B) in the portable telephone terminal apparatus, in contrast to the prior art. This permits band selection and gain control with extremely high accuracy.

Further, the same reference voltage is applied to the source electrodes of the series field effect transistors on one side and the series field effect transistors on the other side and to the gate electrodes of the shunt field effect transistors on one side and the shunt field effect transistors on the other side. This permits accurate control against a fluctuation in the reference voltage. Further, this reduces the number of voltages to be applied, and hence simplifies the circuit configuration.

When the series and shunt field effect transistors have a high threshold voltage, the reference voltage can be set to be a reference voltage such as a ground voltage. This avoids completely the necessity of considering the fluctuation in the reference voltage. Thus, setting is necessary only for the control voltage. This simplifies the design, and permits accurate gain control. Further, this eliminates the necessity of the reference voltage, and hence simplifies the circuit configuration.

As described above, according to the invention, in an attenuator, regardless of band selection, variable resistors of respective bands perform similar gain control operation on the basis of the same gain control voltage, so that the variable resistor of the selected band substantially continuously controls the output of the power amplifier, and that the gain control is performed by a single gain control voltage. This avoids a difference in the gain during the band selection, and hence permits gain control operation with extremely high accuracy during the band selection.

As a result, in a portable telephone terminal apparatus provided with the above-mentioned attenuator, regardless of band selection, avoided is the necessity of the adjustment of the gain control voltage at the time of band selection, and hence resolved is the problem of delay caused by the transient response time in the drain voltage applied to each attenuator. This avoids the problem that the output $P_{out}$ of the portable telephone terminal apparatus temporarily deviates from the desired line at the time of band selection. Thus, high quality speech is achieved. Further, in the band selection in the high frequency section, merely a single reference voltage is sufficient for the setting of the drain voltage to the attenuator. This simplifies the control of band selection.

Further, the high frequency section does not need attenuators for respective bands. This reduces space requirement and the size.

BRIEF DESCRIPTION OF THE DRAWINGS

FIG. 15 is a diagram used for describing problems in a portable telephone terminal apparatus using the attenuator of FIG. 13.

DESCRIPTION OF THE PREFERRED EMBODIMENTS

Embodiment 1 of the invention is described below with reference to FIGS. 1–7.

Figure 1:
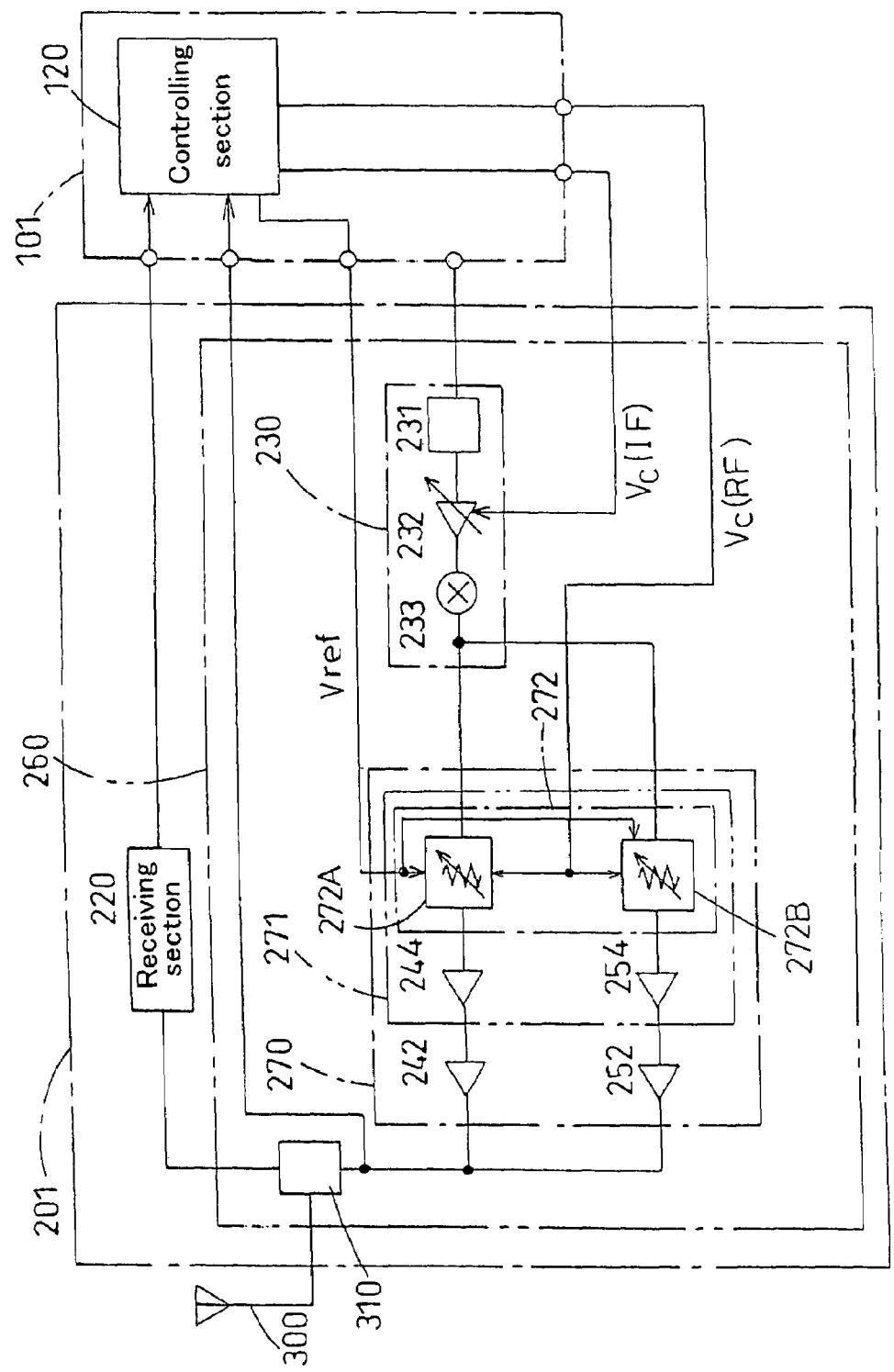
FIG. 1 is a block diagram showing the configuration of a portable telephone terminal apparatus according to Embodiment 1 of the invention.

FIG. 1 is a block diagram showing the configuration of a portable telephone terminal apparatus according to Embodiment 1 of the invention. The configuration and the operation of the portable telephone terminal apparatus according to Embodiment 1 are described below with reference to FIG. 1. As shown in FIG. 1, the portable telephone terminal apparatus is constructed from a microcomputer logic section or the like, and comprises: a baseband section 101 for processing a voice signal; and a radio section 201 for receiving the voice signal processed in the baseband section 101 and then performing communication with a base station.

The radio section 201 comprises: a transmitting section 260 for generating a transmission signal to be transmitted to the base station; and a receiving section 220 for receiving a transmission signal transmitted from the base station.

The transmitting section 260 comprises: an intermediate frequency section 230 for performing the modulation of the voice signal provided from the baseband section 101 and the mixing of the signals for the purpose of frequency conversion; and a high frequency section 270 for amplifying a high frequency signal outputted from the intermediate frequency section 230 and then providing the signal through a switch 310 to an antenna 300.

The intermediate frequency section 230 comprises: a modulator 231; a variable gain intermediate frequency amplifier 232 for amplifying the output signal of the modulator 231; and a mixer 233 for converting the output signal of the variable gain intermediate frequency amplifier 232 into a high frequency signal. The variable gain intermediate frequency amplifier 232 is constructed from a bipolar transistor in many cases. The gain of the variable gain intermediate frequency amplifier 232 can be adjusted discretely in several steps of 5–6 dB intervals. This gain is controlled stepwise in the range of 20 dB or the like by a discrete gain control voltage.

The high frequency section 270 comprises: again controller 271 for controlling the gain for the high frequency signal outputted from the intermediate frequency section 230, and outputting selectively the bands A and B; and a power amplifier 242 for power-amplifying the band A output of the gain controller 271; and a power amplifier 252 for power-amplifying the band B output of the gain controller 271. The gain controller 271 can adjust the gain in the range of 40 dB or wider, and can selectively output the bands A and B. This gain is controlled continuously in the range of 30 dB or wider by a continuously varying gain control voltage.

The gain controller 271 comprises: a preamplifier (medium power amplifier) 244 for band A; a preamplifier (medium power amplifier) 254 for band B; and an attenuator 272 used in the bands A and B. The attenuator 272 comprises a variable resistor 272A for band A and a variable resistor 272B for band B. The variable resistor 272A for band A is cascaded to the preamplifier 244, while the variable resistor 272B for band B is cascaded to the preamplifier 254. The attenuator 272 adjusts the gain (the amount of attenuation) for the high frequency signal of the band A to be inputted to the power amplifier (high power amplifier) 242, and at the same time adjusts the gain (the amount of attenuation) for the high frequency signal of the band B to be inputted to the power amplifier (high power amplifier) 252.

The attenuator 272 adjusts the gain in the bands A and B in the range of 40 dB or wider, and hence has the function of changing the amount of attenuation in the range of 30 dB or wider. In this embodiment, the power amplification is performed respectively by a two-stage amplifier composed of the preamplifier 244 and the power amplifier 242 and by a two-stage amplifier composed of the preamplifier 254 and the power amplifier 252. However, the power amplification may be performed each by a single stage amplifier. The attenuator 272 receives a reference voltage Vref and a gain control voltage Vc(RF). Then, the variable resistor 272A and the variable resistor 272B adjust the amount of attenuation in response to the intensity of the gain control voltage Vc(RF) with reference to the reference voltage Vref.

For the purpose of band selection, a supply voltage is applied selectively to the preamplifier 244 and the power amplifier 242 (for band A) and the preamplifier 254 and the power amplifier 252 (for band B). That is, the supply voltage is applied selectively to the two sets of amplifiers, and thereby causes any one of the amplifier sets to operate, so as to realize band selection.

The baseband section 101 comprises a controlling section 120 composed of a microcomputer logic or the like. The controlling section 120 detects the signal intensity of the reception signal of the receiving section 220. In the case of band A, the controlling section 120 detects the output level of the power amplifier 242, then sets a target value for the output level of the power amplifier 242 in correspondence to the signal intensity of the reception signal, then compares the output level of the power amplifier 242 with the target value for the output level of the power amplifier 242, then provides a gain control voltage Vc(RF) corresponding to the comparison result onto the attenuator 272, and provides a gain control voltage Vc(IF) to the variable gain intermediate frequency amplifier 232, so as to perform the follow control for the gain of the attenuator 272 and the variable gain intermediate frequency amplifier 232 such that the output level of the power amplifier 242 agrees with the target value for the output level of the power amplifier 242.

In the case of band B, the controlling section 120 detects the output level of the power amplifier 252, then sets a target value for the output level of the power amplifier 252 in correspondence to the signal intensity of the reception signal, then compares the output level of the power amplifier 252 with the target value for the output level of the power amplifier 252, then provides a gain control voltage Vc(RF) corresponding to the comparison result onto the attenuator 272, and provides a gain control voltage Vc(IF) to the variable gain intermediate frequency amplifier 232, so as to perform the follow control for the gain of the attenuator 272 and the variable gain intermediate frequency amplifier 232 such that the output level of the power amplifier 252 agrees with the target value for the output level of the power amplifier 252.

In this portable telephone terminal apparatus, the gain control in the gain controller 271 and the variable gain intermediate frequency amplifier 232 realizes the gain control in the range of 50 dB or wider. In the PDC standard, the input stage of the mixer 233 operates in a 200-MHz band, while the output stage of the mixer 233 operates in a 940-MHz band or a 1441-MHz band. The output of the power amplifier 242 or the power amplifier 252 has a signal level of +30 dBm (where 0 dBm=1 mW). The output of the preamplifier 244 or the preamplifier 254 has a signal level of +8 dBm. The output of the attenuator 272 has a signal level of −16 dBm. The output of the mixer 233 has a signal level of −15 dBm. The output of the variable gain intermediate frequency amplifier 232 has a signal level of −20 dBm.

In this situation, when the gain controller 271 performs gain control in the range of 30 dB, and when the variable gain intermediate frequency amplifier 232 performs gain control in the range of 20 dB, the signal level in the output of the variable gain intermediate frequency amplifier 232 varies in the range from −20 dBm to −40 dBm. The signal level in the output of the mixer 233 varies in the range from −15 dBm to −35 dBm. The signal level in the output of the attenuator 272 varies in the range from −16 dBm to −46 dBm. The signal level in the output of the preamplifier 244 or the preamplifier 254 varies in the range from +8 dBm to −22 dBm. The signal level in the output of the power amplifier 242 or the power amplifier 252 varies in the range from +30 dBm to −20 dBm.

Specific configuration and operation of the attenuator 272 are described below with reference to FIGS. 2–7.

Figure 2:
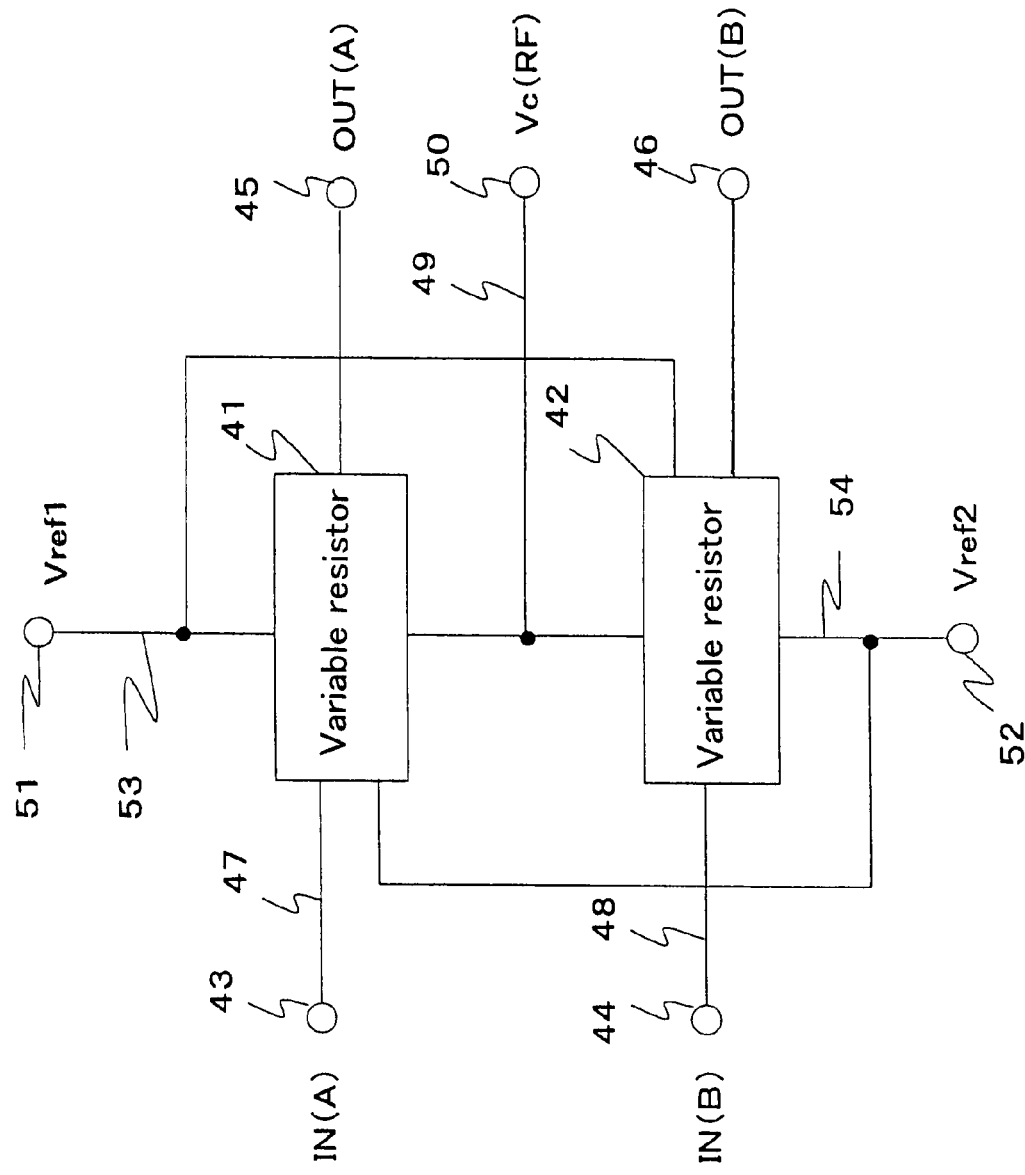
FIG. 2 is a schematic block diagram showing the configuration of the attenuator in the portable telephone terminal apparatus of FIG. 1.
Figure 3:
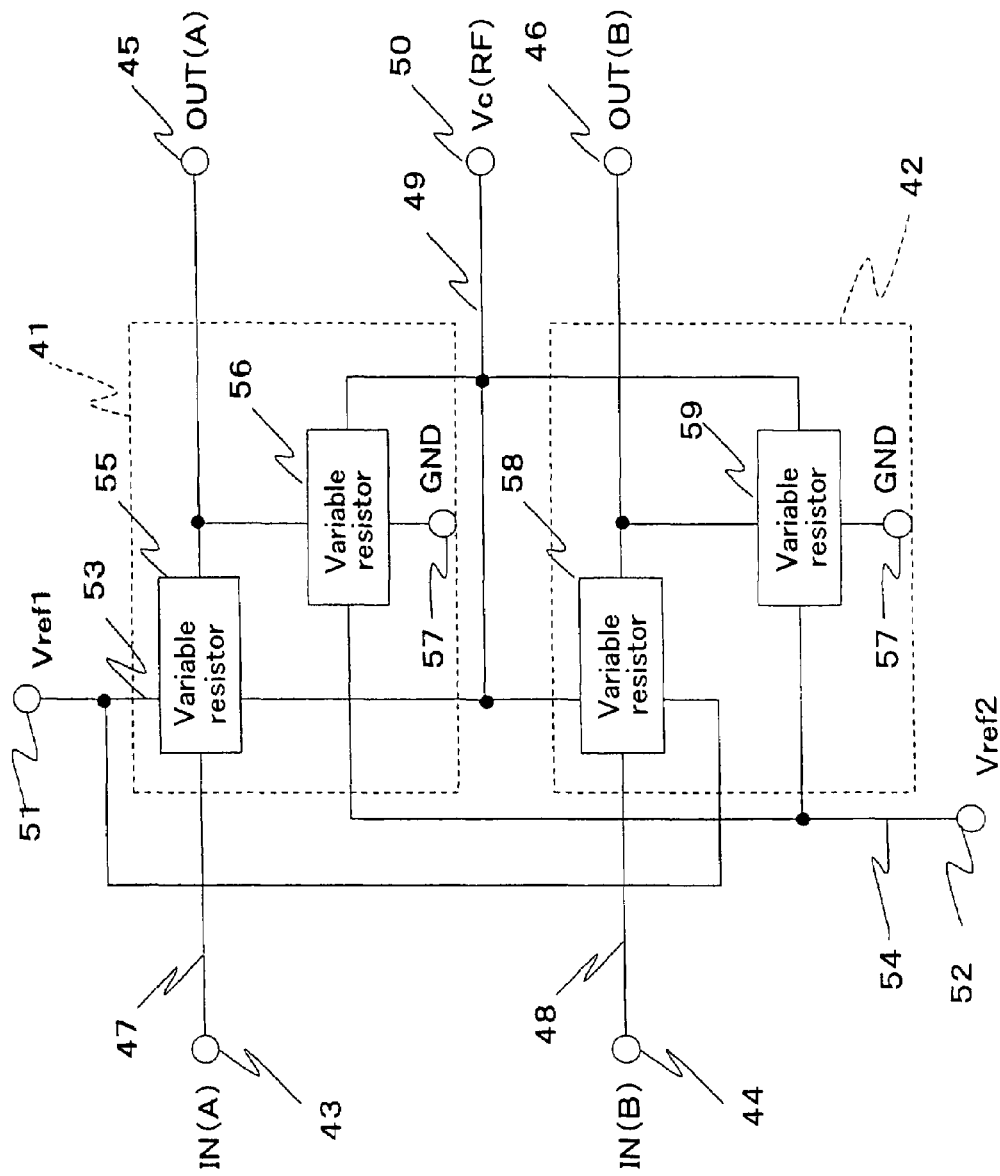
FIG. 3 is a detailed block diagram showing the configuration of the attenuator in the portable telephone terminal apparatus of FIG. 1.
Figure 4:
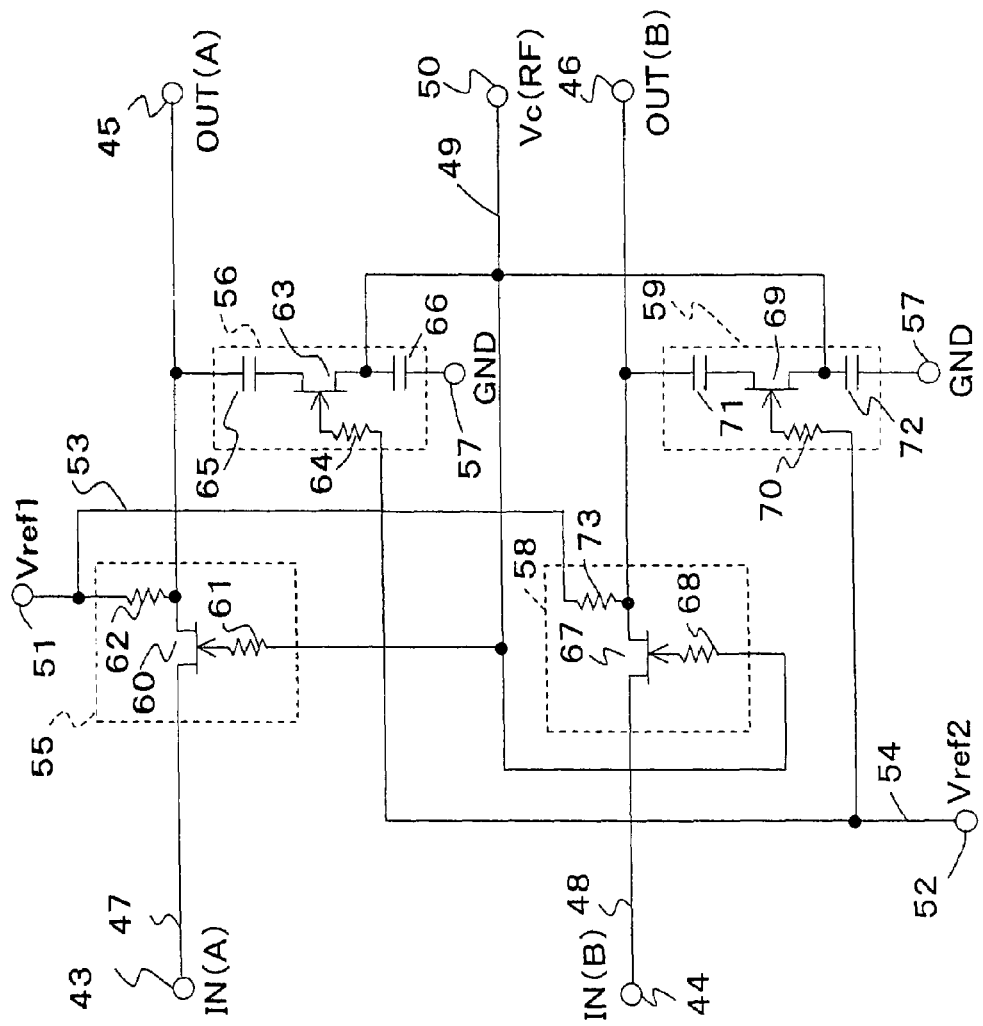
FIG. 4 is a circuit diagram showing a specific configuration of the attenuator of FIG. 3.

FIGS. 2 and 3 are schematic block diagrams showing the configuration of the attenuator (semiconductor integrated circuit apparatus) 272. FIG. 4 is a circuit diagram showing a specific configuration of the attenuator 272. The attenuator 272 is fabricated on a single semiconductor substrate (GaAs) by an integrated circuit process. However, this configuration maybe fabricated on a silicon substrate. In the case of silicon, silicon-germanium, or the like substrate, the microcomputer logic can be fabricated simultaneously on the substrate. When the attenuator is fabricated on a single semiconductor substrate, the threshold voltage can easily be equalized in the field effect transistors serving as variable resistors.

The attenuator having such configuration performs the switching of the selected band the gain control for each band. This permits the control to go into a desired gain in a shorter time during the gain control at band selection, in comparison with the case that independent attenuators are used for respective bands. This allows a single attenuator to perform simultaneous band selection and gain control for each band, without the necessity of a combination of independent attenuators for respective bands. Further, when an increased number of variable resistors are arranged in parallel to the signal line, satisfactory gain control is achieved in the selection and the switching of an increased number of bands (modes).

As shown in FIGS. 2, 3, and 4, the attenuator comprises: a variable resistor 41 inserted in a signal line (A) 47 which connects an input terminal (A) 43 serving as a signal inputting section IN(A) to an output terminal (A) 45 serving as a signal outputting section OUT(A); and a variable resistor 42 inserted in a signal line (B) 48 which is provided in parallel to the signal line (A) 47 and which connects an input terminal (B) 44 serving as a signal inputting section IN(B) for high frequency signal to an output terminal (B) 46 serving as a signal outputting section OUT(B).

More specifically, the attenuator comprises: at least one or more series variable resistors 55 inserted in the signal line (A) 47 which connects the input terminal (A) 43 serving as a signal inputting section IN(A) to the output terminal (A) 45 serving as a signal outputting section OUT(A); at least one or more shunt variable resistors 56 inserted between the output terminal (A) 45 and a reference potential section (GND) 57; at least one or more series variable resistors 58 inserted in a signal line (B) 48 which is provided in parallel to the signal line (A) 47 and which connects the input terminal (B) 44 serving as a signal inputting section IN(B) for high frequency signal to the output terminal (B) 46 serving as a signal outputting section OUT(B); and at least one or more shunt variable resistors 59 inserted between the output terminal (B) 46 and the reference potential section (GND) 57. The variable resistors 55, the variable resistors 56, the variable resistors 58, and the variable resistors 59 are connected to a gain control line 49.

In this attenuator, reference voltage applying terminals 51 and 52 serving as a reference voltage applying section are respectively connected through reference voltage lines 53 and 54 to the variable resistors 41 and 42. Then, reference voltages Vref1 and Vref2 are provided respectively to the reference voltage applying terminals 51 and 52. A gain control voltage applying terminal 50 serving as a gain control voltage applying section is connected through the gain control line 49 to each of the resistors 55, 56, 58, and 59.

In the variable resistor 41, resistors 61 and 62 are respectively connected to at least the gate and the source of the field effect transistor 60, while a resistors 64 and capacitors 66 and 65 are respectively connected to at least the gate, the source, and the drain of the field effect transistor 63. The drain of the field effect transistor 60 constituting the variable resistor 41 in the signal line (A) 47 is connected to the input terminal (A) 43, while its source is connected to the output terminal (A) 45. The capacitor 65 at the drain of the field effect transistor 63 is connected to the output terminal (A) 45, while the capacitor 66 at the source is connected to the reference potential section (GND) 57.

In the variable resistor 42, resistors 68 and 73 are respectively connected to at least the gate and the source of the field effect transistor 67, while a resistors 70 and capacitors 72 and 71 are respectively connected to at least the gate, the source, and the drain of the field effect transistor 69. The drain of the field effect transistor 67 constituting the variable resistor 42 in the signal line (B) 48 is connected to the input terminal (B) 44, while its source is connected to the output terminal (B) 46. The capacitor 71 at the drain of the field effect transistor 69 is connected to the output terminal (B) 46, while the capacitor 72 at the source is connected to the reference potential section (GND) 57.

Further, the gate of the field effect transistor 60 constituting the variable resistor 41 is connected through the resistor 61 and the gain control line 49 to the gain control voltage applying terminal 50. The source of the field effect transistor 63 is connected through the gain control line 49 to the gain control voltage applying terminal 50.

Further, the gate of the field effect transistor 67 constituting the variable resistor 42 is connected through the resistor 68 and the gain control line 49 to the gain control voltage applying terminal 50. The source of the field effect transistor 69 is connected through the gain control line 49 to the gain control voltage applying terminal 50.

The reference voltage Vref1 from the reference voltage applying terminal 51 is provided respectively through the resistors 62 and 73 to the source of the field effect transistor 60 constituting the variable resistor 41 and to the source of the field effect transistor 67 constituting the variable resistor 42. The reference voltage Vref2 from the reference voltage applying terminal 52 is provided respectively through the resistors 64 and 70 to the gate of the field effect transistor 63 constituting the variable resistor 41 and to the gate of the field effect transistor 69 constituting the variable resistor 42.

In order to prevent the entrance of a high frequency signal, a lower limit and an upper limit for the resistors 61, 64, 68, and 70 are set, for example, as follows. First, the lower limit is 1 kΩ. The reason for this setting is that if an isolation of 20 dB or higher is not established, a high frequency signal enters into the circuit and causes an adverse influence on the gain control characteristics such as an increase in the loss. An isolation of 20 dB or higher is obtained by the above-mentioned setting value.

The upper limit is 100 kΩ. The reason for this setting is as follows. That is, when a gate leakage current, for example, of 1 μA flows through a field effect transistor, and when a resistor having a resistance of 100 kΩ is inserted to the gate of the field effect transistor, the voltage drop $V_{drop}$ across the resistor becomes equal to $$V_{drop} = 1 \times 10^{-6} \times 100 \times 10^{3} = 0.1 \quad \text{(V)}$$

Thus, if the resistance exceeds 100 kΩ, the deviation in the control voltage exceeds 0.1 V, and hence causes a not-negligible influence on the gain control characteristics.

The operation of the attenuator having such configuration is described below. The portable telephone terminal apparatus is driven by a lithium battery or the like at a voltage up to 3.0 V or the like. The threshold voltage of the field effect transistor indicates a bias voltage that causes the variable resistor to begin gain control operation. In other words, this voltage indicates a bias voltage at which the field effect transistor goes completely off (pinch off). All the field effect transistors used in the variable resistors 41 and 42 have the same threshold voltage Vth. In this example, the threshold voltage is −0.5 V.

Diverse reference voltages Vref1 and Vref2 are applied respectively to the reference voltage applying terminals 51 and 52 of the variable resistors 41 and 42. Described below are these reference voltages Vref1 and Vref2 applied to the reference voltage applying terminals 51 and 52 of the variable resistors 41 and 42.

Here, the variable resistor constructed from the field effect transistor goes completely off (pinch off) when its gate-source voltage VGS goes below the threshold voltage Vth of the field effect transistor (VGS≦Vth). At this time, the resistance becomes maximum. The gate-source voltage VGS of each field effect transistor is expressed by the difference (VG−VS) of the gate voltage VG from the source voltage VS. Further, the resistance varies depending on the combination of the gain control voltage Vc(RF) and the reference voltage Vref1 or Vref2. Thus, when the setting values for the reference voltages Vref1 and Vref2 are changed, the range of the gain control voltage Vc(RF) where the gain control is possible by the variable resistor is adjustable.

As for the ranges of the gain control voltage Vc(RF) where the variable resistors 41 and 42 operates respectively, it is sufficient to set these ranges of the gain control voltage Vc(RF) ranges such that the gain control operation ranges of the variable resistors 41 and 42 overlap substantially with each other. Thus, these ranges may be set arbitrarily as long as this condition is satisfied.

Here, the threshold (pinch off) voltage of the field effect transistor 60 of the variable resistor 55 in the variable resistor 41 is denoted by Vth_T_A, while the threshold (pinch off) voltage of the field effect transistor 63 of the variable resistor 56 is denoted by Vth_S_A. Further, the gain control voltage that causes the field effect transistor 60 of the variable resistor 55 to go completely off (pinch off) is denoted by VcOFF_T_A, while the gain control voltage that causes the field effect transistor 63 of the variable resistor 56 to go completely off (pinch off) is denoted by VcOFF_S_A.

Then, since the gate-source voltage VGS of each field effect transistor is expressed by the difference (VG−VS) of the gate voltage VG from the source voltage VS, the following relations hold.

$$Vth\_T\_A = VcOFF\_T\_A - Vref1 \quad (1)$$

$$Vth\_S\_A = Vref2 - VcOFF\_S\_A \quad (2)$$

As seen from Equations (1) and (2), the gain control voltage is applied to the gate of the field effect transistor 60 and to the source of the field effect transistor 63. Thus, when the gain control voltage increases, the gain control operation of the field effect transistor 60 goes from off to on, whereas the gain control operation of the field effect transistor 63 goes from on to off. That is, these field effect transistors vary complementarily.

Further, the threshold (pinch off) voltage of the field effect transistor 67 of the variable resistor 58 in the variable resistor 42 is denoted by Vth_T_B, while the threshold (pinch off) voltage of the field effect transistor 69 of the variable resistor 59 is denoted by Vth_S_B. Further, the gain control voltage that causes the field effect transistor 67 of the variable resistor 58 to go completely off (pinch off) is denoted by VcOFF_T_B, while the gain control voltage that causes the field effect transistor 69 of the variable resistor 59 to go completely off (pinch off) is denoted by VcOFF_S_B. Then, since the gate-source voltage VGS of each field effect transistor is expressed by the difference (VG−VS) of the gate voltage VG from the source voltage VS, the following relations hold.

$$Vth\_T\_B = VcOFF\_T\_B - Vref1 \quad (3)$$

$$Vth\_S\_B = Vref2 - VcOFF\_S\_B \quad (4)$$

As seen from Equations (3) and (4), the gain control voltage is applied to the gate of the field effect transistor 67 and to the source of the field effect transistor 69. Thus, when the gain control voltage increases, the gain control operation of the field effect transistor 67 goes from off to on, whereas the gain control operation of the field effect transistor 69 goes from on to off. That is, these field effect transistors vary complementarily.

When it is assumed that Vth_T_A= Vth_S_A=Vth_T_B=Vth_S_B, from Equations (1) and (2), the following relation is obtained.

$$Vref2 = VcOFF\_T\_A + VcOFF\_S\_A - Vref1 \quad (5)$$

Further, from Equations (3) and (4), the following relation is obtained.

$$Vref2 = VcOFF\_T\_B + VcOFF\_S\_B - Vref1 \quad (6)$$

As seen from Equation (5), the voltage Vref2 applied to the reference voltage applying section 52 of the field effect transistor 63 of the variable resistor 56 needs to be set at a value which is lower than the voltage Vref1 applied to the reference voltage applying section 51 of the field effect transistor 60 of the variable resistor 55 and which is equal to the gain control voltage that causes the field effect transistor 60 to go completely off (pinch off) plus the gain control voltage that causes the field effect transistor 63 to go completely off (pinch off) minus the voltage Vref1 applied to the reference voltage applying section 51 of the field effect transistor 60.

As seen from Equation (6), the voltage Vref2 applied to the reference voltage applying section 52 of the field effect transistor 69 of the variable resistor 59 needs to be set at a value which is lower than the voltage Vref1 applied to the reference voltage applying section 51 of the field effect transistor 67 of the variable resistor 58 and which is equal to the gain control voltage that causes the field effect transistor 67 to go completely off (pinch off) plus the gain control voltage that causes the field effect transistor 69 to go completely off (pinch off) minus the voltage Vref1 applied to the reference voltage applying section 51 of the field effect transistor 67.

Since the gain control operation ranges of the variable resistors 41 and 42 overlap substantially with each other, the following relations hold.

$$VcOFF\_T\_A = VcOFF\_T\_B = VcOFF\_T$$

$$VcOFF\_S\_A = VcOFF\_S\_B = VcOFF\_S$$

Thus, Equations (5) and (6) can be rewritten as follows.

$$Vref2 = VcOFF\_T + VcOFF\_S - Vref1 \quad (7)$$

As seen from Equation (7), the voltage Vref2 applied to the reference voltage applying section 52 of the field effect transistors 63 and 69 needs to be set at a value which is lower than the voltage Vref1 applied to the reference voltage applying section 51 of the field effect transistors 60 and 67 and which is equal to the gain control voltage that causes the field effect transistors 60 and 67 to go completely off (pinch off) plus the gain control voltage that causes the field effect transistors 63 and 69 to go completely off (pinch off) minus the voltage Vref1 applied to the reference voltage applying section 51 of the field effect transistors 60 and 67.

In this embodiment, since VcOFF_T=1.8 V and VcOFF_S=1.1 V, the following relation is obtained.

$$Vref2 = 2.9 - Vref1 \quad (8)$$

Thus, the voltage Vref2 needs to be set at a value lower than the voltage Vref1 and equal to 2.9 V minus Vref1. In the setting of this embodiment, Vref1=1.6 V and Vref2=1.3 V.

As described above, in order that the gain control is performed by a single gain control voltage, the reference voltage Vref1 of the variable resistor 41 and the reference voltage Vref2 of the variable resistor 42 are set appropriately such that the variable resistor 41 for band (A) and the variable resistor 42 for band (B) operate in the same gain control voltage range. Then, the gain control can be performed by a single gain control voltage. This permits accurate band selection and gain control in the portable telephone terminal apparatus.

Figure 5A:
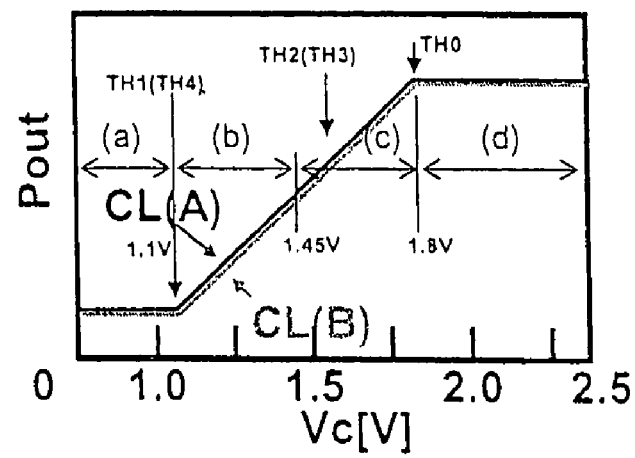
FIGS. 5A, 5B, and 5C are characteristics diagrams of the gain control in the attenuator of FIG. 4 as a function of the gain control voltage.
Figure 5B:
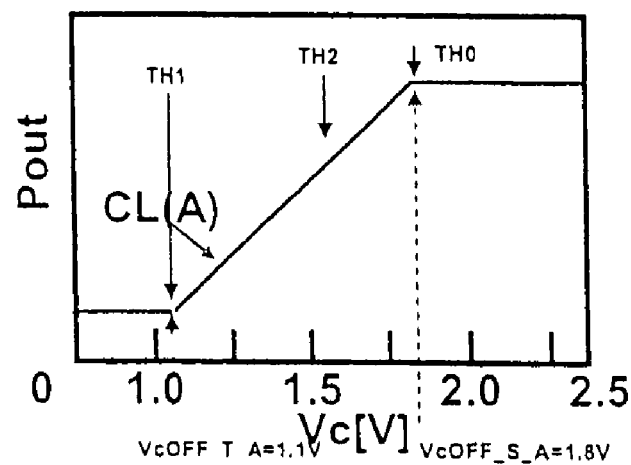
Figure 5C:
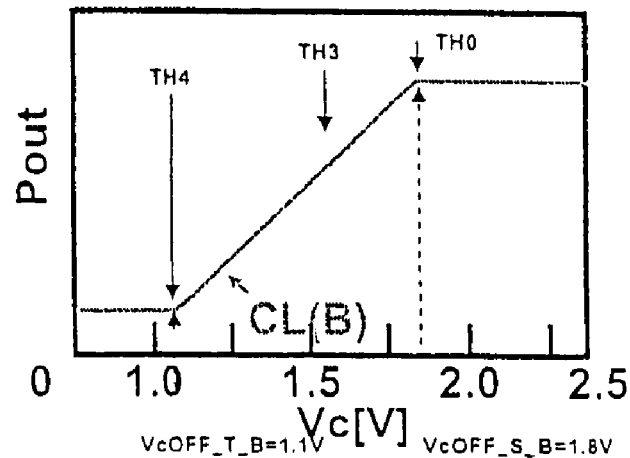

FIGS. 5A, 5B, and 5C are characteristics diagrams of the gain control in the attenuator of FIG. 4 as a function of the gain control voltage Vc(RF).

FIG. 5A is an overlay of the composite characteristics of the variable resistors 55 and 56 and the composite characteristics of the variable resistors 58 and 59. FIG. 5B shows the composite characteristics of the variable resistors 55 and 56, while FIG. 5C shows the composite characteristics of the variable resistors 58 and 59.

The threshold voltage of the series field effect transistor 60 for the cell region CL(A) is denoted by Vth_T_A, while the threshold voltage of the shunt field effect transistor 63 is denoted by Vth_S_A. Then, the following relation holds.

$$Vth\_T\_A = Vth\_S\_A = -0.5 \text{ V}$$

When the reference voltages are denoted by Vref1 and Vref2, the following relations hold.

$$Vref1 = 1.6 \text{ V}$$

$$Vref2 = 1.3 \text{ V}$$

The gain control voltage that causes the series field effect transistor 60 to go completely off (pinch off) is defined as VcOFF_T_A, while the gain control voltage that causes the shunt field effect transistor 63 to go completely off (pinch off) is defined as VcOFF_S_A. Then, the following relation holds.

$$Vth\_T\_A = VcOFF\_T\_A - Vref1$$

Thus, the following relation is obtained.

$$VcOFF\_T\_A = Vth\_T\_A + Vref2 = 1.1 \text{ V}$$

Similarly, the following relation holds.

$$Vth\_S\_A = Vref2 - VcOFF\_S\_A$$

Thus, the following relation is obtained (See FIG. 5B).

$$VcOFF\_S\_A = Vref2 - Vth\_S\_A = 1.8 \text{ V}$$

The threshold voltage of the series field effect transistor 67 for the cell region CL(B) is denoted by Vth_T_B, while the threshold voltage of the shunt field effect transistor 69 is denoted by Vth_S_B. Then, the following relation holds.

$$Vth\_T\_B = Vth\_S\_B = -0.5 \text{ V}$$

When the reference voltages are denoted by Vref1 and Vref2, the following relations hold.

$$Vref1 = 1.6 \text{ V}$$

$$Vref2 = 1.3 \text{ V}$$

The gain control voltage that causes the series field effect transistor 67 to go completely off (pinch off) is defined as VcOFF_T_B, while the gain control voltage that causes the shunt field effect transistor 69 to go completely off (pinch off) is defined as VcOFF_S_B. Then, the following relation holds.

$$Vth\_T\_B = VcOFF\_T\_B - Vref1$$

Thus, the following relation is obtained.

$$VcOFF\_T\_B = Vth\_T\_B + Vref1 = 1.1 \text{ V}$$

Similarly, the following relation holds.

$$Vth\_S\_B = Vref2 - VcOFF\_S\_B$$

Thus, the following relation is obtained (See FIG. 5C).

$$VcOFF\_S\_B = Vref2 - Vth\_S\_B = 1.8 \text{ V}$$

FIG. 5A shows an overlay of the characteristics of FIG. 5B and the characteristics of FIG. 5C. As seen from the figure, these characteristics agree with each other. Thus, when band selection is performed at the time of move, for example, from the cell region CL(A) to the cell region CL(B), the output of the attenuator for the cell region CL(A) agrees with that for the cell region CL(B) without the necessity of simultaneous adjustment of the gain control voltage Vc provided to the attenuator 253.

The operation of the attenuator of FIG. 4 is described below with reference to FIGS. 5A, 5B, and 5C.

When all the field effect transistors has a threshold voltage Vth of −0.5 V, the reference voltage Vref1 is set at 1.6 V, while the reference voltage Vref2 is set at 1.3 V.

Described below is the case of communication in the cell region CL(A). At that time, a signal is inputted to the input terminal 43, while no signal is inputted to the input terminal 44.

When a voltage of 0–1.1 V is applied to the gain control voltage applying terminal 50 (in the gain control voltage range (a) in FIGS. 5A–5C), the resistance of the variable resistor 55 in the variable resistor 41 is at maximum, while the resistance of the variable resistor 56 is at minimum. Thus, when a signal is inputted through the input terminal 43, the intensity $P_{out}(A)$ of the output signal from the output terminal 45 is minimized. Further, since no signal is inputted to the input terminal 44, no signal is outputted from the output terminal 46. In this state, the band (A) is selected, while the band (B) is non-selected.

When a voltage exceeding 1.1V is applied to the gain control voltage applying terminal 50 (in the gain control voltage range (b) in FIGS. 5A–5C), the resistance of the variable resistor 56 in the variable resistor 41 remains minimum, while the resistance of the variable resistor 55 begins to decrease. Thus, the intensity $P_{out}(A)$ of the output signal from the output terminal 45 begins to increase. In normal cases, the gain control voltage range where the variable resistor implemented by a field effect transistor performs gain control operation is around 0.35 (0.3–0.4) V. Thus, the gain increases almost linearly by approximately 20 dB by the time when the voltage applied to the gain control voltage applying terminal 50 reaches 1.45 V. In this state, the band (A) is selected and hence gain control for the band (A) is performed, while the band (B) is non-selected.

When the voltage applied to the gain control voltage applying terminal 50 reaches 1.45 V (in the gain control voltage range (c) in FIGS. 5A–5C), the resistance of the variable resistor 55 (in the variable resistor 41) having decreased so far reaches the minimum, while the resistance of the variable resistor 56 having remained minimum so far begins to increase. Thus, the intensity $P_{out}(A)$ of the output signal from the output terminal 45 increases further. Accordingly, the gain increases further almost linearly by approximately 20 dB by the time when the voltage applied to the gain control voltage applying terminal 50 reaches 1.8 V. In this state, the band (A) is selected and hence gain control for the band (A) is performed, while the band (B) is non-selected.

When the voltage applied to the gain control voltage applying terminal 50 reaches 1.8 V (in the gain control voltage range (d) in FIGS. 5A–5C), the resistance of the variable resistor 55 in the variable resistor 41 remains minimum, while the resistance of the variable resistor 56 having increased so far reaches the maximum. Thus, the intensity $P_{out}(A)$ of the output signal from the output terminal 45 reaches the maximum. In this state, the band (A) is selected and hence gain control for the band (A) is performed, while the band (B) is non-selected.

Even when a voltage exceeding 1.8 V is applied to the gain control voltage applying terminal 50, the resistance of the variable resistor 55 in the variable resistor 41 remains minimum, while the resistance of the variable resistor 56 remains maximum. Thus, the intensity $P_{out}(A)$ of the output signal from the output terminal 45 remains maximum. In this state, the band (A) is selected and hence gain control for the band (A) is performed, while the band (B) is non-selected.

Described next is the case of communication in the cell region CL(B). At that time, a signal is inputted to the input terminal 44, while no signal is inputted to the input terminal 43.

When a voltage of 0–1.1 V is applied to the gain control voltage applying terminal 50 (in the gain control voltage range (a) in FIGS. 5A–5C), the resistance of the variable resistor 58 in the variable resistor 42 is at maximum, while the resistance of the variable resistor 59 is at minimum. Thus, when a signal is inputted through the input terminal 44, the intensity $P_{out}(B)$ of the output signal from the output terminal 46 is minimized. Further, since no signal is inputted to the input terminal 43, no signal is outputted from the output terminal 45. In this state, the band (B) is selected, while the band (A) is non-selected.

When a voltage exceeding 1.1V is applied to the gain control voltage applying terminal 50 (in the gain control voltage range (b) in FIGS. 5A–5C), the resistance of the variable resistor 59 in the variable resistor 42 remains minimum, while the resistance of the variable resistor 58 begins to decrease. Thus, the intensity $P_{out}(B)$ of the output signal from the output terminal 46 begins to increase. In normal cases, the gain control voltage range where the variable resistor implemented by a field effect transistor performs gain control operation is around 0.35 (0.3–0.4) V. Thus, the gain increases almost linearly by approximately 20 dB by the time when the voltage applied to the gain control voltage applying terminal 50 reaches 1.45 V. In this state, the band (B) is selected and hence gain control for the band (B) is performed, while the band (A) is non-selected.

When the voltage applied to the gain control voltage applying terminal 50 reaches 1.45 V (in the gain control voltage range (c) in FIGS. 5A–5C), the resistance of the variable resistor 58 (in the variable resistor 42) having decreased so far reaches the minimum, while the resistance of the variable resistor 59 having remained minimum so far begins to increase. Thus, the intensity $P_{out}(B)$ of the output signal from the output terminal 46 increases further. Accordingly, the gain increases further almost linearly by approximately 20 dB by the time when the voltage applied to the gain control voltage applying terminal 50 reaches 1.8 V. In this state, the band (B) is selected and hence gain control for the band (B) is performed, while the band (A) is non-selected.

When the voltage applied to the gain control voltage applying terminal 50 reaches 1.8 V (in the gain control voltage range (d) in FIGS. 5A–5C), the resistance of the variable resistor 58 in the variable resistor 42 remains minimum, while the resistance of the variable resistor 59 having increased so far reaches the maximum. Thus, the intensity $P_{out}(B)$ of the output signal from the output terminal 46 reaches the maximum. In this state, the band (B) is selected and hence gain control for the band (B) is performed, while the band (A) is non-selected.

Even when a voltage exceeding 1.8 V is applied to the gain control voltage applying terminal 50, the resistance of the variable resistor 58 in the variable resistor 42 remains minimum, while the resistance of the variable resistor 59 remains maximum. Thus, the intensity $P_{out}(B)$ of the output signal from the output terminal 46 remains maximum. In this state, the band (B) is selected and hence gain control for the band (B) is performed, while the band (A) is non-selected.

As described above, according to this embodiment, the attenuator is arranged such that the variable resistors 41 and 42 implemented by field effect transistors are connected in parallel, and that the gain control operation ranges of the variable resistors 41 and 42 overlap with each other. As a result, the gain control operation becomes common to both the variable resistors 41 and 42. This avoids the necessity of the adjustment of the gain control voltage at the time of band selection. The gain control operation ranges of the variable resistors 41 and 42 can be adjusted by adjusting the reference voltages using an external microcomputer.

Figure 6:
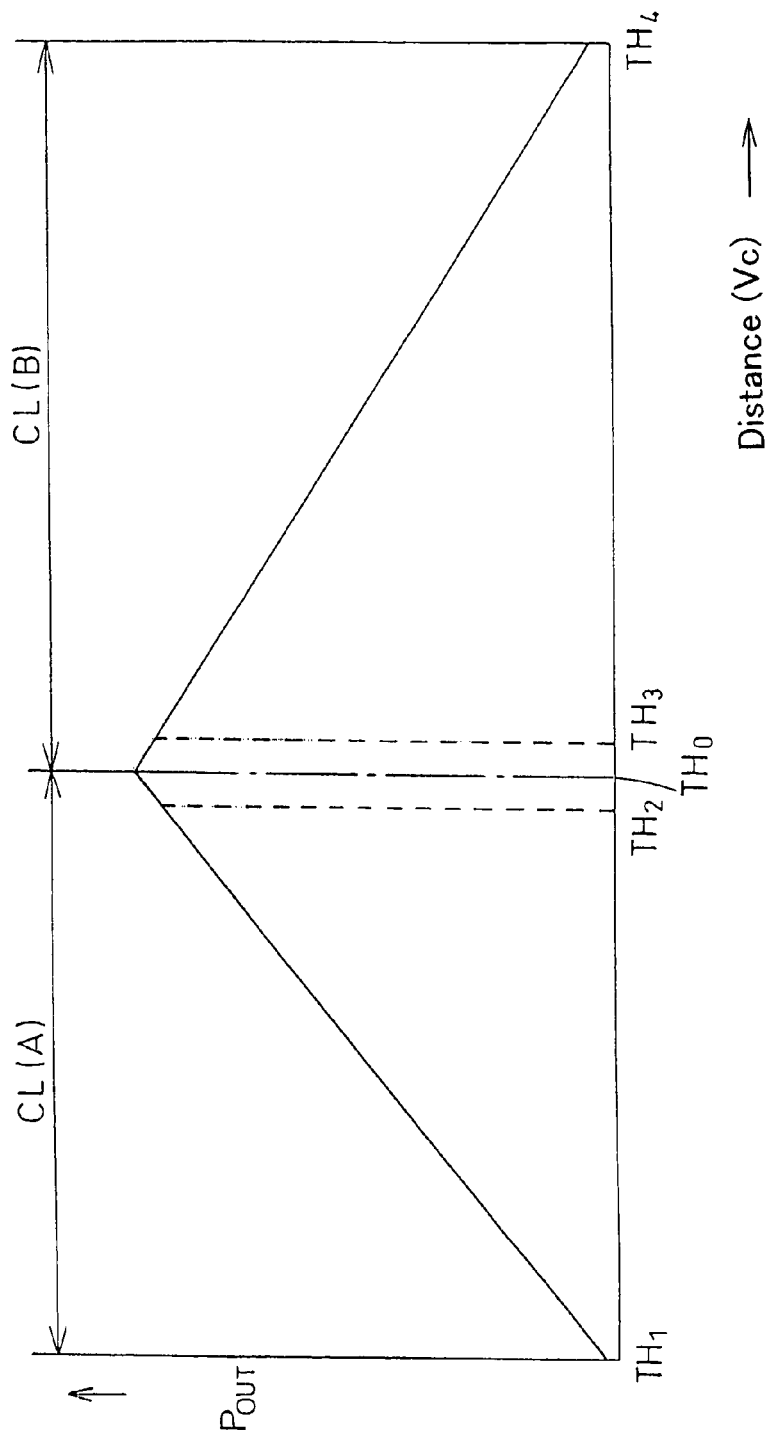
FIG. 6 is a characteristics diagram showing the output power of a portable telephone terminal apparatus using the attenuator of FIG. 4 as a function of the distance from a base station when the portable telephone terminal apparatus moves from a cell to another.

That is, in the high frequency section of the portable telephone terminal apparatus, regardless of band selection, variable resistors fabricated as a single semiconductor device for respective bands perform similar gain control operation on the basis of the same gain control voltage, so that the variable resistor of the selected band substantially continuously controls the output. As a result, avoided is the necessity of the adjustment of the gain control voltage at the time of band selection, and hence resolved is the problem of delay caused by the transient response time in the drain voltage applied to each attenuator. This avoids the problem that the output level of the power amplifier temporarily deviates from the target value at the time of band selection as shown in FIG. 15 illustrating the prior art. And hence, this avoids the problem that the output Pout of the portable telephone terminal apparatus temporarily deviates from the desired line at the time of band selection as shown in FIG. 6. Thus, high quality speech is achieved. Further, in the band selection in the high frequency section, merely a single reference voltage is sufficient for the setting of the drain voltage to the attenuator. This simplifies the circuit configuration of the controlling section 120. Further, the high frequency section does not need attenuators for respective bands. This reduces space requirement and the size.

Figure 7:
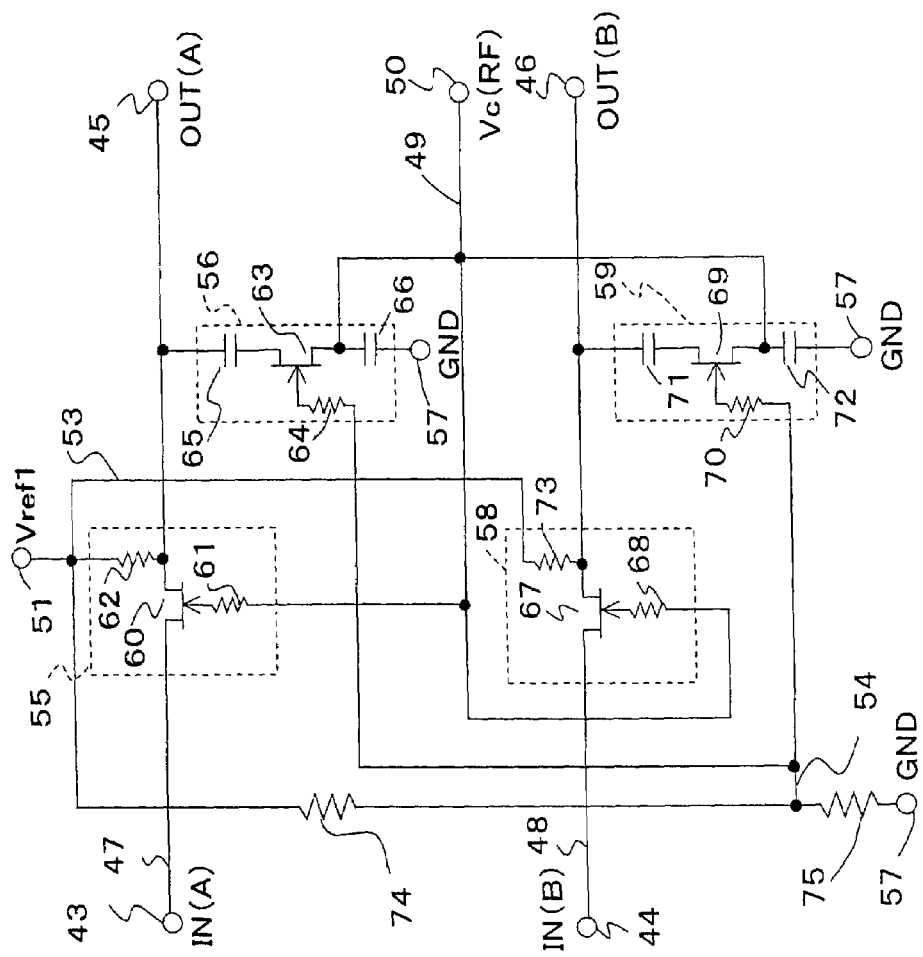
FIG. 7 a circuit diagram showing a specific configuration of the attenuator of FIG. 4, where bias resistors 74 and 75 are provided that permit a reference voltage to be applied to the respective variable resistors.

In this embodiment, the reference voltage applying terminal 51 of the variable resistor 55 in the variable resistor 41 for band (A) and of the variable resistor 58 in the variable resistor 42 for band (B) has been provided separately from the reference voltage applying terminal 52 of the variable resistor 56 in the variable resistor 41 for band (A) and of the variable resistor 59 in the variable resistor 42 for band (B). However, the voltage Vref2 may be generated by dividing the voltage Vref1 using bias resistors 74 and 75 as shown in FIG. 7. In this case, merely a single reference voltage applying terminal is used. This simplifies the circuit. The bias resistors 74 and 75 block the entrance of the high frequency signal. For the purpose of blocking the entrance of the high frequency signal, the resistance of the bias resistors 74 and 75 is set to be approximately 5 kΩ or higher and 100 kΩ or lower.

The reason why the resistance of the bias resistors 74 and 75 is set to be approximately 5 kΩ or higher and 100 kΩ or lower is described below.

The reason why the lower limit is approximately 5 kΩ is first described below. If the bias resistors 74 and 75 have a small resistance, the high frequency signal passes to the ground (GND), so that gain control operation is not performed. Thus, a resistance of 5 kΩ or higher (an isolation of 40 dB or higher) is necessary. Further, when the reference voltage Vref1 is 3 V, and when the resistance is 5 kΩ, the current flowing through the bias resistors 74 and 75 is $I=3$ V/10 kΩ=300 µA Thus, when the resistance is below 5 kΩ, the current exceeds 300 µA, and results in a high power consumption.

The reason why the upper limit is 100 kΩ is as follows. When the reference voltage Vref1 is 3 V, the current flowing through the bias resistors 74 and 75 is $I=3$ V/200 kΩ=15 µA Further, the voltage across the bias resistor 75 is $V=15$ µA×100 kΩ=1.5 V Then, if a leakage current of the field effect transistor is 1 µA, a bias fluctuation occurs in the intensity of 1 µA×100 kΩ=0.1 V. This causes a deviation in the gain control characteristics, and prevents accurate gain control.

This embodiment has been described for the case that the threshold voltage is the same for all of the field effect transistor 60 serving as the variable resistor 55, the field effect transistor 63 serving as the variable resistor 56, the field effect transistor 67 serving as the variable resistor 58, and the field effect transistor 69 serving as the variable resistor 59. In particular, the relation between the reference voltages Vref1 and Vref2 has been described with the assumption that the threshold voltage is the same for these field effect transistors.

However, the threshold voltage need not be the same for all the field effect transistors, and may be different for some of them. When the threshold voltage is different, the relation between the reference voltages Vref1 and Vref2 can be adjusted appropriately depending on the situation. When the threshold voltages are set appropriately, the use of merely a single reference voltage permits the above-mentioned operation.

That is, in order to cause the variable resistors 55, 56, 58, and 59 to adjust the amount of attenuation within the appropriate gain control voltage range, two reference voltages need to be set appropriately in case that the threshold voltages of the field effect transistors are given. On the contrary, in case that the reference voltages are given, the threshold voltages of the field effect transistors need to be set appropriately. In short, when the relation among the threshold voltages of the field effect transistors, the reference voltages, and the gain control voltage is set appropriately, the attenuator performs desired operation.

In order that the attenuation characteristics for band A becomes the same as that for band B, it is preferable that the characteristics such as the on-resistance (RON) and the parasitic capacitances (Cgd, Cgs, and Cds) other than the threshold value are the same for these field effect transistors.

Figure 8:
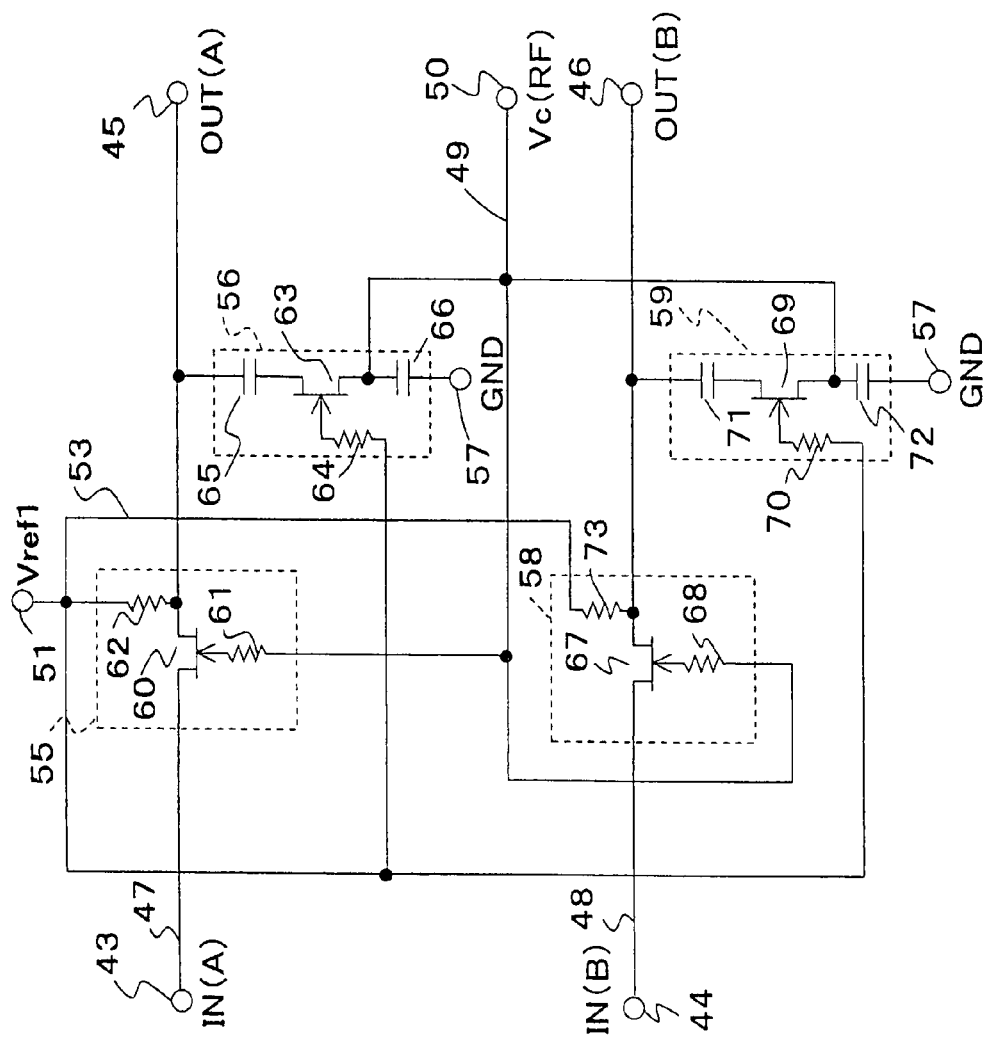
FIG. 8 is a circuit diagram showing a specific configuration of an attenuator according to Embodiment 2 of the invention.
Figure 9:
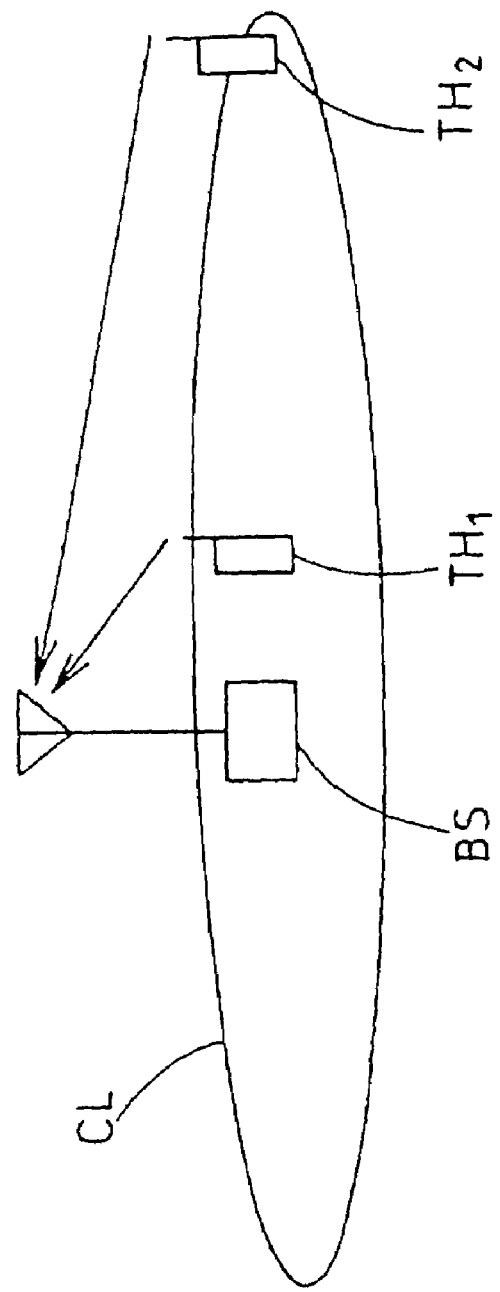
FIG. 9 is a schematic diagram showing the positional relation between a base station and a portable telephone terminal apparatus.
Figure 10:
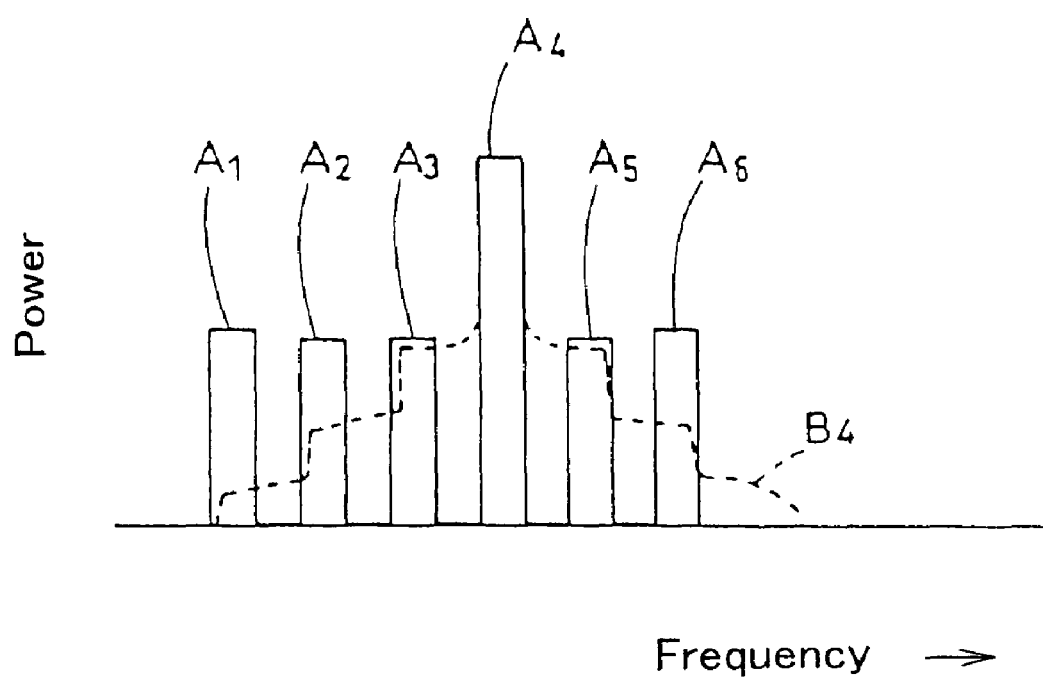
FIG. 10 is a diagram illustrating the intensity of the reception signals of respective channels at a base station.
Figure 11:
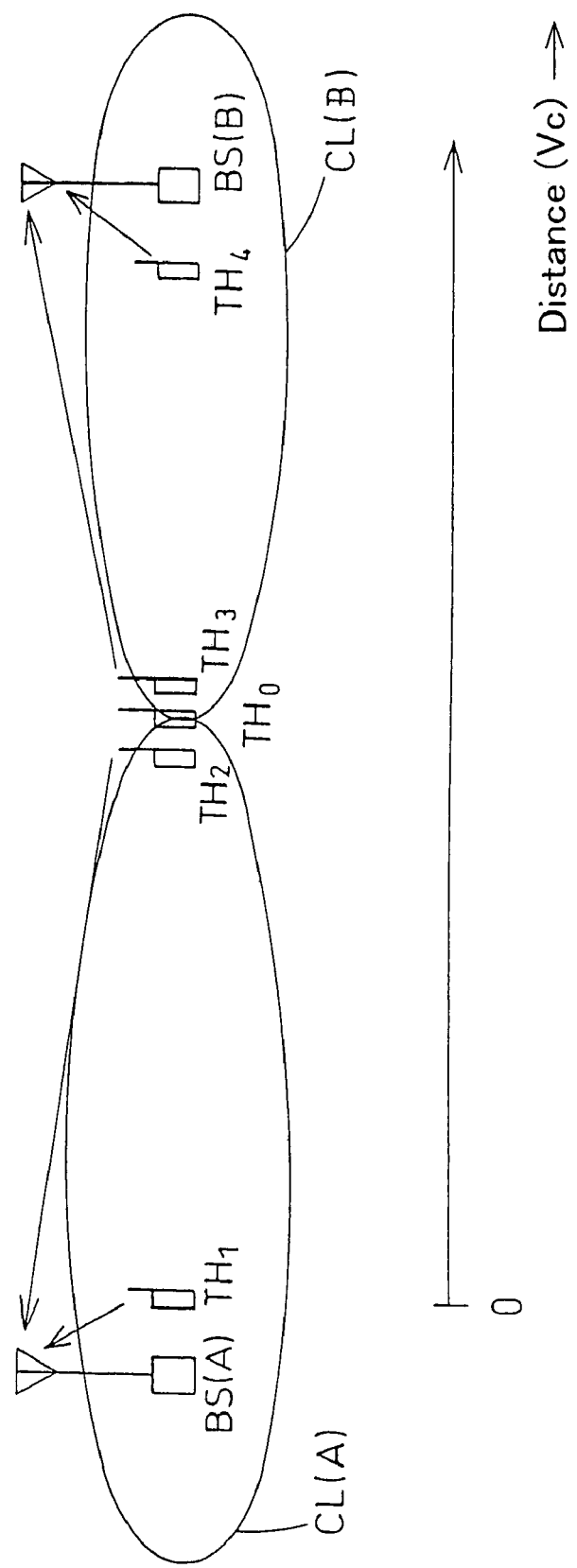
FIG. 11 is a schematic diagram showing the positional relation with a base station when a portable telephone terminal apparatus moves from a cell to another.
Figure 12:
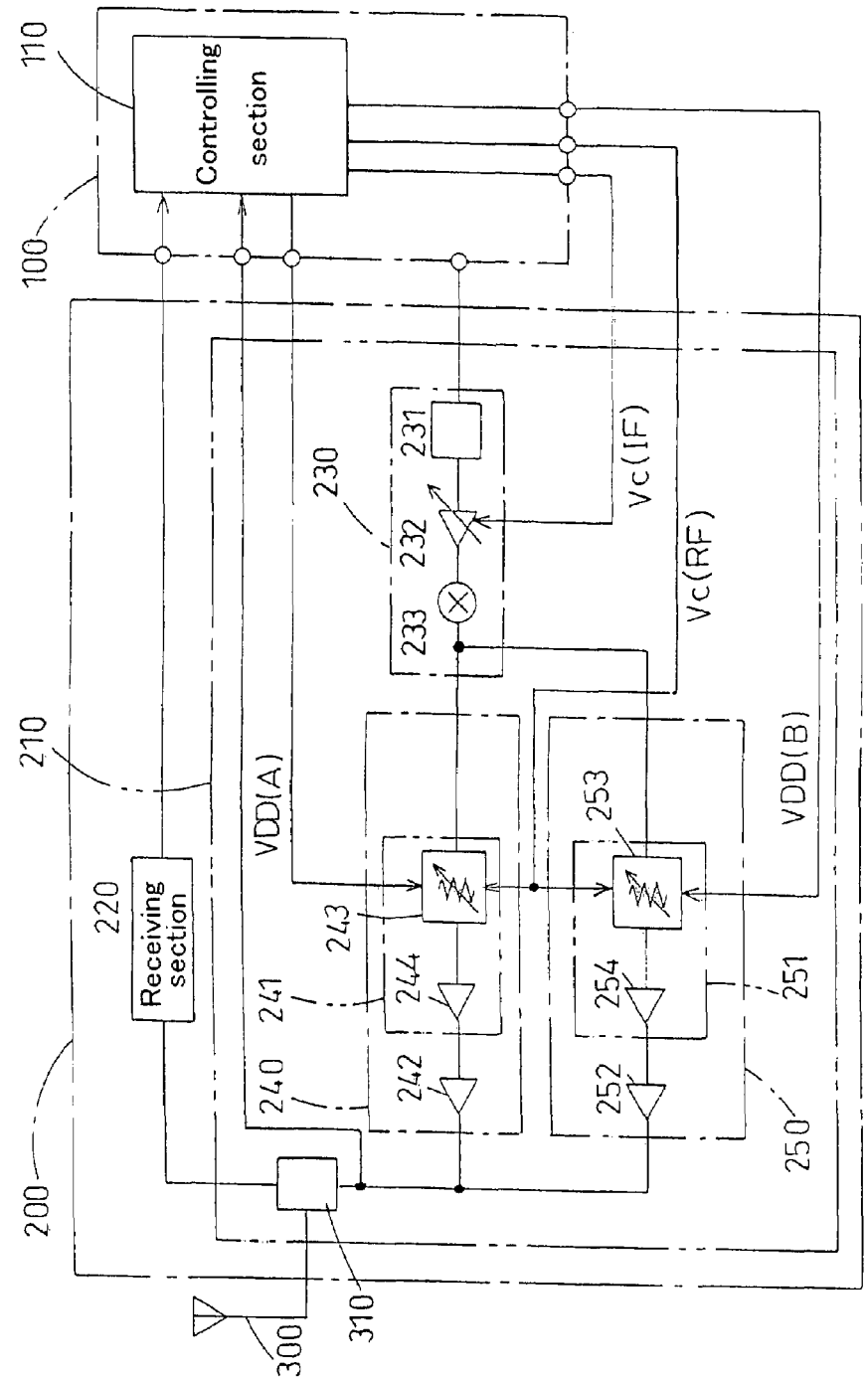
FIG. 12 is a block diagram showing the configuration of a prior art portable telephone terminal apparatus.
Figure 13:
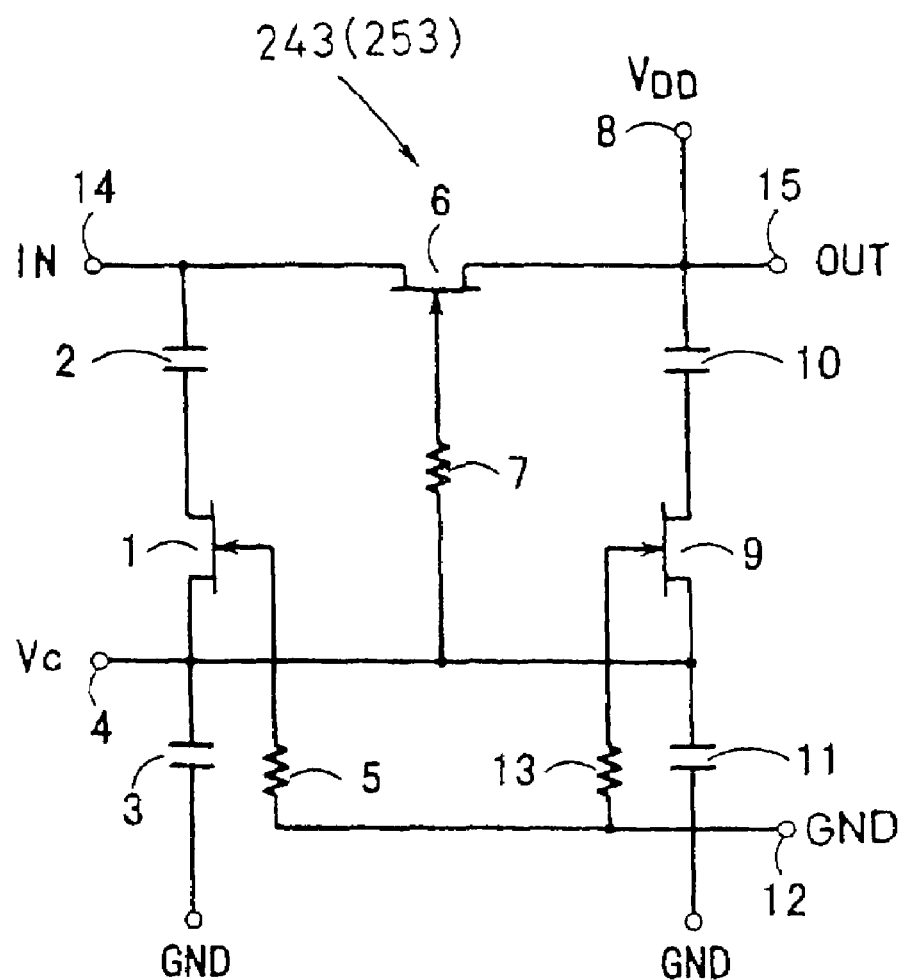
FIG. 13 is a circuit diagram showing the configuration of an attenuator used in the portable telephone terminal apparatus of FIG. 12.
Figure 14A:
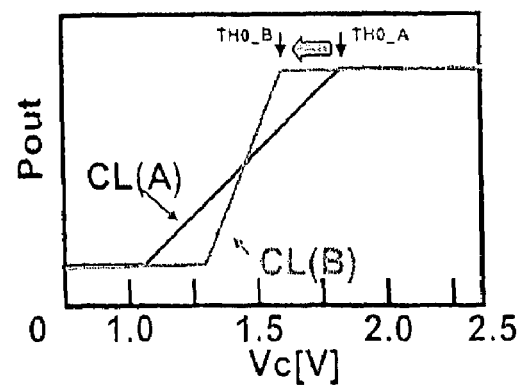
FIGS. 14A, 14B, and 14C are characteristics diagrams for the gain control voltage setting in the attenuator of FIG. 13 when a portable telephone terminal apparatus moves from a cell to another.
Figure 14B:
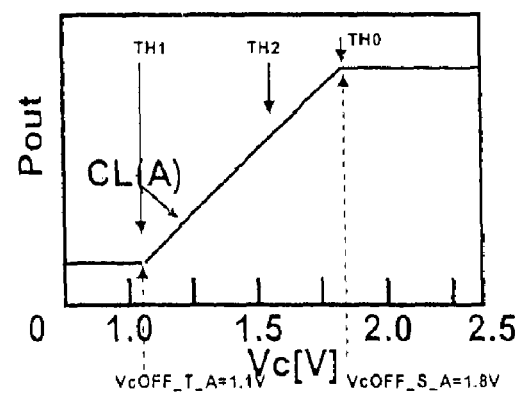
Figure 14C:
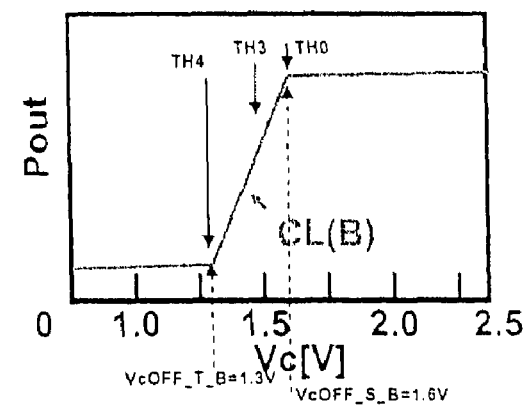

FIG. 8 shows the configuration of an attenuator according to Embodiment 2, where the field effect transistor 60 serving as the variable resistor 55 and the field effect transistor 67 serving as the variable resistor 58 have a threshold voltage different from that of the field effect transistor 63 serving as the variable resistor 56 and the field effect transistor 69 serving as the variable resistor 59, and where the same reference voltage is applied to these field effect transistors 60, 67, 63, and 69.

Described below is an example of the reference voltage and the threshold voltages of the field effect transistors in the case that the same reference voltage is applied as shown in the configuration of FIG. 8, and in the case that the gain is adjusted within the gain control voltage range of 1.1–1.8 V.

When the gain is adjusted within the gain control voltage range of 1.1–1.8 V, and when the reference voltage is set at 1.6 V, according to the relations shown in Equations (1), (2), (3), and (4), the threshold voltage is set at −0.5 V for the field effect transistors 60 and 67, and at −0.2 V for the field effect transistors 63 and 69. This setting permits gain control operation similar to that of FIGS. 5A–5C.

According to such configuration that the threshold voltages of the field effect transistors are set appropriately and that a single reference voltage is used, that is, according to the configuration that the same reference voltage is applied to the source electrodes of the field effect transistors 60 and 67 connected in series to the signal lines and to the gate electrodes of the field effect transistors 63 and 69 connected in a shunt position to the signal lines, the fluctuation in the characteristics caused by a fluctuation in the reference voltage can easily be predicted and hence taken into account. This permits accurate control. Further, this reduces the number of reference voltages used, and hence simplifies the circuit configuration.

Figure 16:
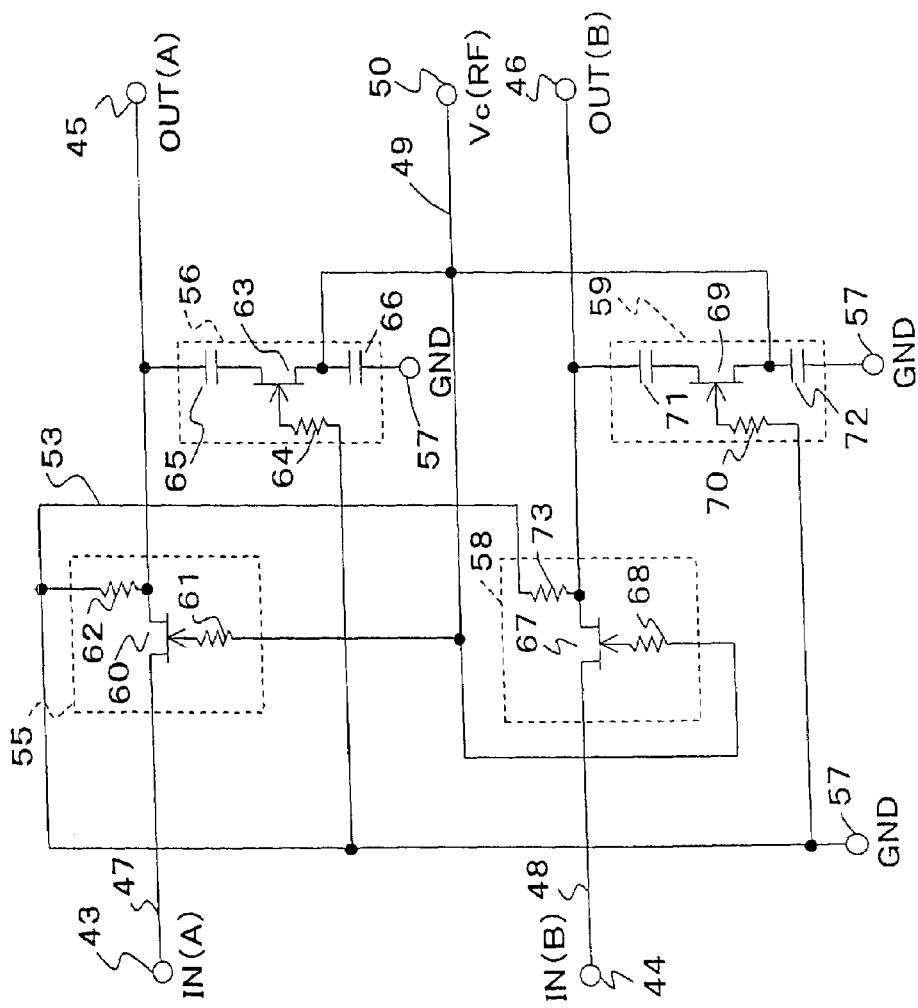
FIG. 16 is a circuit diagram showing a specific configuration of an attenuator according to Embodiment 3 of the invention where the reference voltage can be eliminated.

FIG. 16 shows the configuration of an attenuator according to Embodiment 3. In this attenuator, the field effect transistor 60 serving as the variable resistor 55 and the field effect transistor 67 serving as the variable resistor 58 have a threshold voltage different from that of the field effect transistor 63 serving as the variable resistor 56 and the field effect transistor 69 serving as the variable resistor 59. Further, these field effect transistors 60, 67, 63, and 69 are grounded to the reference potential section (GND) 57.

In comparison with the configuration of FIG. 8, the threshold voltage of the field effect transistors 60 and 67 has a larger difference from that of the field effect transistors 63 and 69. This reduces further the number of reference voltages.

Described below is the threshold voltage difference for permitting the ground potential to be used as the reference voltage. When the gain is adjusted in the circuit of FIG. 8 within the gain control voltage range of 1.1–1.8 V, according to the relations shown in Equations (1), (2), (3), and (4), the threshold voltage difference between the field effect transistors 60 and 67 and the field effect transistors 63 and 69 is expressed as follows.

$$Vth\_T\_A - Vth\_S\_A = VcOFF\_T\_A + VcOFF\_S\_A - 2*Vref1 \quad (9)$$

$$Vth\_T\_B - Vth\_S\_B = VcOFF\_T\_B + VcOFF\_S\_B - 2*Vref1 \quad (10)$$

Thus, the following relations are obtained.

$$Vth\_T\_A - Vth\_S\_A = 2.9 - 2*Vref1 \quad (11)$$

$$Vth\_T\_B - Vth\_S\_B = 2.9 - 2*Vref1 \quad (12)$$

In the circuit of FIG. 16, since the reference voltage Vref1 is grounded to the reference potential section (GND), field effect transistors having a large threshold difference of 2.9 V or the like are sufficient.

Described below are the values of threshold voltages of the field effect transistors 60, 67, 63, and 69 in the case that the gain is adjusted, for example, within the gain control voltage range of 1.1–1.8 V similarly to Embodiment 1.

When the gain is adjusted within the gain control voltage range of 1.1–1.8 V, and when the reference voltage is set at 0 V, according to the relations shown in Equations (1), (2), (3), and (4), the threshold voltage is set at +1.1 V for the field effect transistors 60 and 67, and at −1.8 V for the field effect transistors 63 and 69. This setting permits gain control operation similar to that of FIGS. 5A–5C.

According to such configuration that the threshold voltages of the field effect transistors are set appropriately so that the necessity of the reference voltage is eliminated, that is, according to the configuration that the reference potential section (GND) 57 is connected to the source electrodes of the field effect transistors 60 and 67 connected in series to the signal lines and to the gate electrodes of the field effect transistors 63 and 69 connected in a shunt position to the signal lines, that is, according to the configuration that the source electrodes of the field effect transistors 60 and 67 and the gate electrodes of the field effect transistors 63 and 69 are grounded, the necessity of considering the fluctuation in the reference voltage is completely avoided. Thus, setting is necessary only for the control voltage. This simplifies the design, and permits accurate gain control. Further, this reduces the number of reference voltages, and hence simplifies the circuit configuration.

In this embodiment, two variable resistors consisting of the band (A) variable resistor 41 and the band (B) variable resistor 42 implemented by field effect transistors have been connected in parallel to each other. However, a larger number of variable resistors may be arranged in parallel to each other. When an increased number of variable resistors are arranged in parallel, gain control can be performed in an increased number of bands.

In this embodiment, the variable resistors 56 and 59 have been inserted between the output terminals 45 and 46 and the reference potential section 57 into a shunt position to the signal lines 47 and 48. However, the variable resistors maybe inserted between the input terminals 43 and 44 and the reference potential section 57. In this case, the shunt variable resistors 56 and 59 are inserted into the input side of the variable resistors 55 and 58 connected in series to the signal lines 47 and 48. This improves the distortion characteristics of the variable resistors 55 and 58 connected in series, and hence permits such gain control that degradation in the distortion characteristics is suppressed even for a large input signal.

Further, in this embodiment, nothing has been connected in parallel between the drain and the source of each of the field effect transistors 60, 63, 67, and 69 constituting the variable resistors 41 and 42. However, in order to suppress the variation in the intrinsic resistance of the field effect transistors 60, 63, 67, and 69 and in order to control the range of variable resistance, a resistor or the like may be connected in parallel between the drain and the source of each of the field effect transistors 60, 63, 67, and 69. This stabilizes the amount of gain control in each variable resistor, and hence permits gain control with extremely high accuracy.

Furthermore, in this embodiment, the field effect transistors 60, 63, 67, and 69 constituting the variable resistors 41 and 42 have been provided with a single gate. However, multi-gate type field effect transistors having a plurality of gate electrodes maybe used. When each field effect transistor has an increased number of gate electrodes, a wider gain control range is obtained. Further, degradation in the distortion characteristics in the gain control is suppressed more satisfactorily even for a large input signal.

Furthermore, in this embodiment, field effect transistors 60, 63, 67, and 69 have been used for implementing the variable resistors 41 and 42. However, the present invention is not limited to such configuration. Devices of another type such as diodes may be used. Each of the series variable resistors and the shunt variable resistors has been constructed from a single field effect transistor. However, each variable resistor may be constructed from a series circuit composed of two or more field effect transistors or, alternatively, devices of another type.

The control of the amount of attenuation by means of a diode is performed by controlling the forward current of the diode and thereby varying the on-resistance.

The attenuator according to the invention is applicable to various mobile telecommunication schemes (such as CDMA (IS-95), GSM, EDGE, UMTS, PCS, DCS, W-CDMA, CDMA2000, and PHS) in addition to the PDC scheme.

What is claimed is:

1. An attenuator, comprising:
    a first signal line including a first variable resistor connecting a first signal inputting section for high frequency signal to a first signal outputting section;
    a second signal line including a second variable resistor connecting a second signal inputting section for high frequency signal to a second signal outputting section, said second signal line being arranged in parallel to said first signal line;
    reference voltage applying sections connected to said first variable resistor and said second variable resistor; and
    a gain control voltage applying section connected to said first variable resistor and said second variable resistor, wherein:
    the attenuation characteristics of said first variable resistor and said second variable resistor and the voltage applied to said reference voltage applying sections are set such that the change of the amount of attenuation relative to the chancre in the gain control voltage becomes the same for said first variable resistor and said second variable resistor,
    said first variable resistor comprises a third variable resistor connecting said first signal inputting section to said first signal outputting section and a fourth variable resistor connecting any one of said first signal inputting section and said first signal outputting section to a reference potential section;
    said second variable resistor comprises a fifth variable resistor connecting said second signal inputting section to said second signal outputting section and a sixth variable resistor connecting any one of said second signal inputting section and said second signal outputting section to said reference potential section; and
    said third variable resistor and said fifth variable resistor are connected to said first reference voltage applying section, while said fourth variable resistor and said sixth variable resistor are connected to said second reference voltage applying section, and while each of said third variable resistor, said fourth variable resistor, said fifth variable resistor, and said sixth variable resistor is connected to said gain control voltage applying section.

2. An attenuator according to claim 1, wherein the voltage values applied to said first reference voltage applying section and said second reference voltage applying section are set such that the gain control voltage range where said third variable resistor performs gain control operation agrees with the gain control voltage range where said fifth variable resistor performs gain control operation, and such that the gain control voltage range where said fourth variable resistor performs gain control operation agrees with the gain control voltage range where said sixth variable resistor performs gain control operation.

3. An attenuator according to claim 1, wherein the voltage values applied to said first reference voltage applying section and said second reference voltage applying section are set such that the gain control voltage range where said fourth variable resistor and said sixth variable resistor perform gain control operation is higher than the gain control voltage range where said third variable resistor and said fifth variable resistor perform gain control operation.

4. An attenuator according to claim 1, wherein the voltage applied to said second reference voltage applying section is lower than the voltage applied to said first reference voltage applying section.

5. An attenuator according to claim 1, wherein the voltage values applied to said first reference voltage applying section and said second reference voltage applying section are set such that the gain control voltage range where said first variable resistor performs gain control operation agrees with the gain control voltage range where said second variable resistor performs gain control operation.

6. An attenuator according to claim 1, wherein:
    said third variable resistor, said fourth variable resistor, said fifth variable resistor, and said sixth variable resistor have such configuration that at least first, second, third, and fourth resistors, are respectively connected to the gates of first, second, third, and fourth field effect transistors;
    the gates of said first and third field effect transistors respectively constituting said third variable resistor and said fifth variable resistor are respectively connected through said first and third resistors to said gain control voltage applying section;
    the sources of said second and fourth field effect transistors respectively constituting said fourth variable resistor and said sixth variable resistor are connected to said gain control voltage applying section;
    the sources of said first and third field effect transistors respectively constituting said third variable resistor and said fifth variable resistor are respectively connected through fifth and sixth resistors to said first reference voltage applying section;

the gates of said second and fourth field effect transistors respectively constituting said fourth variable resistor and said sixth variable resistor are respectively connected through said second and fourth resistors to said second reference voltage applying section;

the drains of said second and fourth field effect transistors respectively constituting said fourth variable resistor and said sixth variable resistor are respectively connected through first and second capacitors to said first signal outputting section and said second signal outputting section;

the sources of said second and fourth field effect transistors respectively constituting said fourth variable resistor and said sixth variable resistor are respectively connected through third and fourth capacitors to said reference potential section; and said first signal line including said third variable resistor and said second signal line including said fifth variable resistor are connected in parallel to each other.

7. An attenuator according to claim 6, wherein the voltage applied to said second reference voltage applying section is set at a value which is lower than the voltage applied to said first reference voltage applying section and which is equal to the gain control voltage that causes said first and third field effect transistors respectively constituting said third variable resistor and said fifth variable resistor to go completely off plus the gain control voltage that causes said second and fourth field effect transistors respectively constituting said fourth variable resistor and said sixth variable resistor to go completely off minus the voltage applied to said first reference voltage applying section.

8. An attenuator according to claim 6, wherein the voltage values applied to said first reference voltage applying section and said second reference voltage applying section are set such that the gain control voltage that causes said first field effect transistor constituting said third variable resistor to go completely off agrees with the gain control voltage that causes said third field effect transistor constituting said fifth variable resistor to go completely off, and such that the gain control voltage that causes said second field effect transistor constituting said fourth variable resistor to go completely off agrees with the gain control voltage that causes said fourth field effect transistor constituting said sixth variable resistor to go completely off.

9. An attenuator according to claim 6, wherein the threshold voltage of said first and third field effect transistors respectively constituting said third variable resistor and said fifth variable resistor and the threshold voltage of said second and fourth field effect transistors respectively constituting said fourth variable resistor and said sixth variable resistor are set such that the operation is performed in a state that the gain control voltage that causes said second and fourth field effect transistors respectively constituting said fourth variable resistor and said sixth variable resistor to go completely off is higher than the gain control voltage that causes said first and third field effect transistors respectively constituting said third variable resistor and said fifth variable resistor to go completely off.

10. An attenuator according to claim 6, wherein the voltage values applied to said first reference voltage applying section and said second reference voltage applying section are set such that the gain control voltage that causes said second and fourth field effect transistors respectively constituting said fourth variable resistor and said sixth variable resistor to go completely off is higher than the gain control voltage that causes said first and third field effect transistors respectively constituting said third variable resistor and said fifth variable resistor to go completely off.

11. An attenuator according to claim 6, wherein the threshold voltage of said second and fourth field effect transistors respectively constituting said fourth variable resistor and said sixth variable resistor is higher than the threshold voltage of said first and third field effect transistors respectively constituting said third variable resistor and said fifth variable resistor.

12. An attenuator according to claim 6, wherein the threshold voltage of said first and third field effect transistors respectively constituting said third variable resistor and said fifth variable resistor and the threshold voltage of said second and fourth field effect transistors respectively constituting said fourth variable resistor and said sixth variable resistor are set such that the gain control voltage range where said first variable resistor performs gain control operation agrees with the gain control voltage range where said second variable resistor performs gain control operation.

13. An attenuator according to claim 6, wherein the threshold voltage of said first and third field effect transistors respectively constituting said third variable resistor and said fifth variable resistor and the threshold voltage of said second and fourth field effect transistors respectively constituting said fourth variable resistor and said sixth variable resistor are set such that the gain control voltage range where said third variable resistor performs gain control operation agrees with the gain control voltage range where said fifth variable resistor performs gain control operation, and such that the gain control voltage range where said fourth variable resistor performs gain control operation agrees with the gain control voltage range where said sixth variable resistor performs gain control operation.

14. An attenuator according to claim 6, wherein the threshold voltage of said first and third field effect transistors respectively constituting said third variable resistor and said fifth variable resistor and the threshold voltage of said second and fourth field effect transistors respectively constituting said fourth variable resistor and said sixth variable resistor are set such that the gain control voltage that causes said first field effect transistor constituting said third variable resistor to go completely off agrees with the gain control voltage that causes said third field effect transistor constituting said fifth variable resistor to go completely off, and such that the gain control voltage that causes said second field effect transistor constituting said fourth variable resistor to go completely off agrees with the gain control voltage that causes said fourth field effect transistor constituting said sixth variable resistor to go completely off.

15. An attenuator according to claim 6, wherein the threshold voltage of said first and third field effect transistors respectively constituting said third variable resistor and said fifth variable resistor and the threshold voltage of said second and fourth field effect transistors respectively constituting said fourth variable resistor and said sixth variable resistor are set such that the operation is performed in a state that the gain control voltage range where said fourth variable resistor and said sixth variable resistor perform gain control operation is higher than the gain control voltage range where said third variable resistor and said fifth variable resistor perform gain control operation.

16. An attenuator comprising:
a first signal line including a first variable resistor connecting a first signal inputting section for high frequency signal to a first signal outputting section;
a second signal line including a second variable resistor connecting a second signal inputting section for high frequency signal to a second signal outputting section, said second signal line being arranged in parallel to said first signal line;

reference voltage applying sections connected to said first variable resistor and said second variable resistor; and a gain control voltage applying section connected to said first variable resistor and said second variable resistor, wherein:

the attenuation characteristics of said first variable resistor and said second variable resistor and the voltage applied to said reference voltage applying sections are set such that the change of the amount of attenuation relative to the change in the gain control voltage becomes the same for said first variable resistor and said second variable resistor, and wherein:

said first variable resistor comprises a third variable resistor connecting said first signal inputting section to said first signal outputting section and a fourth variable resistor connecting any one of said first signal inputting section and said first signal outputting section to a reference potential section;

said second variable resistor comprises a fifth variable resistor connecting said second signal inputting section to said second signal outputting section and a sixth variable resistor connecting any one of said second signal inputting section and said second signal outputting section to said reference potential section; and said third variable resistor, said fourth variable resistor, said fifth variable resistor, and said sixth variable resistor are connected to said first reference voltage applying section, while each of said third variable resistor, said fourth variable resistor, said fifth variable resistor, and said sixth variable resistor is connected to said gain control voltage applying section.

17. An attenuator according to claim 16, wherein:

said third variable resistor, said fourth variable resistor, said fifth variable resistor, and said sixth variable resistor have such configuration that at least first, second, third, and fourth resistors, are respectively connected to the gates of first, second, third, and fourth field effect transistors;

the gates of said first and third field effect transistors respectively constituting said third variable resistor and said fifth variable resistor are respectively connected through said first and third resistors to said gain control voltage applying section;

the sources of said second and fourth field effect transistors respectively constituting said fourth variable resistor and said sixth variable resistor are connected to said gain control voltage applying section;

a first section to which the sources of said first and third field effect transistors respectively constituting said third variable resistor and said fifth variable resistor are respectively connected via said fifth and sixth resistors is connected directly to said first reference voltage applying section;

a seventh resistor is inserted and connected between said first section to which the sources of said first and third field effect transistors respectively constituting said third variable resistor and said fifth variable resistor are respectively connected via said fifth and sixth resistors and a second section which is respectively connected through said second and fourth resistors to the gates of said second and fourth field effect transistors respectively constituting said fourth variable resistor and said sixth variable resistor;

an eighth resistor is inserted and connected between said second section which is respectively connected through said second and fourth resistors to the gates of said second and fourth field effect transistors respectively constituting said fourth variable resistor and said sixth variable resistor and said reference potential section;

the drains of said second and fourth field effect transistors respectively constituting said fourth variable resistor and said sixth variable resistor are respectively connected through first and second capacitors to said first signal outputting section and said second signal outputting section;

the sources of said second and fourth field effect transistors respectively constituting said fourth variable resistor and said sixth variable resistor are respectively connected through third and fourth capacitors to said reference potential section; and said first signal line including said third variable resistor and said second signal line including said fifth variable resistor are connected in parallel to each other.

18. An attenuator according to claim 16, wherein:

said third variable resistor, said fourth variable resistor, said fifth variable resistor, and said sixth variable resistor have such configuration that at least first, second, third, and fourth resistors are respectively connected to the gates of first, second, third, and fourth field effect transistors;

the gates of said first and third field effect transistors respectively constituting said third variable resistor and said fifth variable resistor are respectively connected through said first and third resistors to said gain control voltage applying section;

the sources of said second and fourth field effect transistors respectively constituting said fourth variable resistor and said sixth variable resistor are connected to said gain control voltage applying section;

the sources of said first and third field effect transistors respectively constituting said third variable resistor and said fifth variable resistor are respectively connected through fifth and sixth resistors to said reference voltage applying section;

the gates of said second and fourth field effect transistors respectively constituting said fourth variable resistor and said sixth variable resistor are respectively connected through said second and fourth resistors to said reference voltage applying section;

the drains of said second and fourth field effect transistors respectively constituting said fourth variable resistor and said sixth variable resistor are respectively connected through first and second capacitors to said first signal outputting section and said second signal outputting section;

the sources of said second and fourth field effect transistors respectively constituting said fourth variable resistor and said sixth variable resistor are respectively connected through third and fourth capacitors to said reference potential section; and said first signal line including said third variable resistor and said second signal line including said fifth variable resistor are connected in parallel to each other.

19. An attenuator according to claim 18, wherein said reference voltage applying section is common to said reference potential section.

20. A portable telephone terminal apparatus comprising a baseband section for processing a voice signal and a radio section for receiving the voice signal processed in the baseband section and for performing communication with a base station, wherein: said radio section comprises a transmitting section for generating a transmission signal to be transmitted to said base station and a receiving section for receiving a transmission signal transmitted from said base station; said transmitting section comprises an intermediate frequency section for performing the modulation of the voice signal provided from said baseband section, the control of the gain for an intermediate frequency signal, and the mixing of the signals for the purpose of frequency conversion, and a high frequency section for amplifying a high frequency signal outputted from said intermediate frequency section and then providing the signal to an antenna; and said high frequency section comprises a gain controller for controlling the gain of at least two or more bands of high frequency signals outputted from said intermediate frequency section and for outputting selectively at least two or more bands of high frequency signals, and a first power amplifier and a second power amplifier for selectively power-amplifying at least two or more outputs provided from said gain controller; wherein:

said baseband section comprises a controlling section; and said controlling section detects the signal information of a reception signal of said receiving section, then provides a supply voltage corresponding to the information onto said gain controller, so as to switch the output of said first power amplifier into the output of said second power amplifier, then sets a target value for the output level of said second power amplifier in correspondence to the signal information of said reception signal, then compares the output level of said second power amplifier with the target value for the output level of said second power amplifier, and then provides a gain control voltage corresponding to the comparison result onto said gain controller and a variable gain intermediate frequency amplifier, so as to perform the follow control for the gain of said gain controller and said variable gain intermediate frequency amplifier such that the output level of said second power amplifier agrees with the target value for the output level of said second power amplifier; and wherein said gain controller comprises: a first signal line including a first variable resistor connecting a first signal inputting section for high frequency signal to a first signal outputting section; a second signal line including a second variable resistor connecting a second signal inputting section for high frequency signal to a second signal outputting section, said second signal line being arranged in a number of at least one and in parallel to said first signal line; first reference voltage applying sections connected to each of said first variable resistor and said second variable resistor; and a gain control voltage applying section connected to each of said first variable resistor and said second variable resistor so as to allow the gain control voltage to be provided; where the attenuation characteristics of said first variable resistor and said second variable resistor and the voltage applied to said reference voltage applying sections are set such that the change of the amount of attenuation relative to the change in the gain control voltage becomes the same for said first variable resistor and said second variable resistor.

21. A portable telephone terminal apparatus according to claim 20, wherein:

said first variable resistor is composed of a third variable resistor connecting said first signal inputting section to said first signal outputting section and of a fourth variable resistor connecting any one of said first signal inputting section and said first signal outputting section to a reference potential section;

said second variable resistor is composed of a fifth variable resistor connecting said second signal inputting section to said second signal outputting section and of a sixth variable resistor connecting any one of said second signal inputting section and said second signal outputting section to said reference potential section;

said reference voltage applying sections comprise a first reference voltage applying section and a second reference voltage applying section; and said third variable resistor and said fifth variable resistor are connected to said first reference voltage applying section, while said fourth variable resistor and said sixth variable resistor are connected to said second reference voltage applying section, and while each of said third variable resistor, said fourth variable resistor, said fifth variable resistor, and said sixth variable resistor is connected to said gain control voltage applying section.

22. A portable telephone terminal apparatus according to claim 21, wherein the voltage values applied to said first reference voltage applying section and said second reference voltage applying section are set such that the gain control voltage range where said first variable resistor performs gain control operation agrees with the gain control voltage range where said second variable resistor performs gain control operation.

23. A portable telephone terminal apparatus according to claim 21, wherein the voltage values applied to said first reference voltage applying section and said second reference voltage applying section are set such that the gain control voltage range where said third variable resistor performs gain control operation agrees with the gain control voltage range where said fifth variable resistor performs gain control operation, and such that the gain control voltage range where said fourth variable resistor performs gain control operation agrees with the gain control voltage range where said sixth variable resistor performs gain control operation.

24. A portable telephone terminal apparatus according to claim 21, wherein the voltage applied to said second reference voltage applying section is lower than the voltage applied to said first reference voltage applying section.

25. A portable telephone terminal apparatus according to claim 21, wherein the voltage values applied to said first reference voltage applying section and said second reference voltage applying section are set such that the gain control voltage range where said fourth variable resistor and said sixth variable resistor perform gain control operation is higher than the gain control voltage range where said third variable resistor and said fifth variable resistor perform gain control operation.

26. A portable telephone terminal apparatus according to claim 21, wherein:

said third variable resistor, said fourth variable resistor, said fifth variable resistor, and said sixth variable resistor have such configuration that at least first, second, third, and fourth resistors are respectively connected to the gates of first, second, third, and fourth field effect transistors;

the gates of said first and third field effect transistors respectively constituting said third variable resistor and said fifth variable resistor are respectively connected through said first and third resistors to said gain control voltage applying section;

the sources of said second and fourth field effect transistors respectively constituting said fourth variable resistor and said sixth variable resistor are connected to said gain control voltage applying section;

the sources of said first and third field effect transistors respectively constituting said third variable resistor and said fifth variable resistor are respectively connected through fifth and sixth resistors to said first reference voltage applying section;

the gates of said second and fourth field effect transistors respectively constituting said fourth variable resistor and said sixth variable resistor are respectively connected through said second and fourth resistors to said second reference voltage applying section;

the drains of said second and fourth field effect transistors respectively constituting said fourth variable resistor and said sixth variable resistor are respectively connected through first and second capacitors to said first signal outputting section and said second signal outputting section;

the sources of said second and fourth field effect transistors respectively constituting said fourth variable resistor and said sixth variable resistor are respectively connected through third and fourth capacitors a to said reference potential section; and said first signal line including said third variable resistor and said second signal line including said fifth variable resistor are connected in parallel to each other.

27. A portable telephone terminal apparatus according to claim 26, wherein the voltage applied to said second reference voltage applying section is set at a value which is lower than the voltage applied to said first reference voltage applying section and which is equal to the gain control voltage that causes said first and third field effect transistors respectively constituting said third variable resistor and said fifth variable resistor to go completely off plus the gain control voltage that causes said second and fourth field effect transistors respectively constituting said fourth variable resistor and said sixth variable resistor to go completely off minus the voltage applied to said first reference voltage applying section.

28. A portable telephone terminal apparatus according to claim 26, wherein the voltage values applied to said first reference voltage applying section and said second reference voltage applying section are set such that the gain control voltage that causes said first field effect transistor constituting said third variable resistor to go completely off agrees with the gain control voltage that causes said third field effect transistor constituting said fifth variable resistor to go completely off, and such that the gain control voltage that causes said second field effect transistor constituting said fourth variable resistor to go completely off agrees with the gain control voltage that causes said fourth field effect transistor constituting said sixth variable resistor to go completely off.

29. A portable telephone terminal apparatus according to claim 26, wherein the threshold voltage of said first and third field effect transistors respectively constituting said third variable resistor and said fifth variable resistor and the threshold voltage of said second and fourth field effect transistors respectively constituting said fourth variable resistor and said sixth variable resistor are set such that the operation is performed in a state that the gain control voltage that causes said second and fourth field effect transistors respectively constituting said fourth variable resistor and said sixth variable resistor to go completely off is higher than the gain control voltage that causes said first and third field effect transistors respectively constituting said third variable resistor and said fifth variable resistor to go completely off.

30. A portable telephone terminal apparatus according to claim 26, wherein the voltage values applied to said first reference voltage applying section and said second reference voltage applying section are set such that the gain control voltage that causes said second and fourth field effect transistors respectively constituting said fourth variable resistor and said sixth variable resistor to go completely off is higher than the gain control voltage that causes said first and third field effect transistors respectively constituting said third variable resistor and said fifth variable resistor to go completely off.

31. A portable telephone terminal apparatus according to claim 26, wherein the threshold voltage of said second and fourth field effect transistors respectively constituting said fourth variable resistor and said sixth variable resistor is higher than the threshold voltage of said first and third field effect transistors respectively constituting said third variable resistor and said fifth variable resistor.

32. A portable telephone terminal apparatus according to claim 26, wherein the threshold voltage of said first and third field effect transistors respectively constituting said third variable resistor and said fifth variable resistor and the threshold voltage of said second and fourth field effect transistors respectively constituting said fourth variable resistor and said sixth variable resistor are set such that the gain control voltage range where said first variable resistor performs gain control operation agrees with the gain control voltage range where said second variable resistor performs gain control operation.

33. A portable telephone terminal apparatus according to claim 26, wherein the threshold voltage of said first and third field effect transistors respectively constituting said third variable resistor and said fifth variable resistor and the threshold voltage of said second and fourth field effect transistors respectively constituting said fourth variable resistor and said sixth variable resistor are set such that the gain control voltage range where said third variable resistor performs gain control operation agrees with the gain control voltage range where said fifth variable resistor performs gain control operation, and such that the gain control voltage range where said fourth variable resistor performs gain control operation agrees with the gain control voltage range where said sixth variable resistor performs gain control operation.

34. A portable telephone terminal apparatus according to claim 26, wherein the threshold voltage of said first and third field effect transistors respectively constituting said third variable resistor and said fifth variable resistor and the threshold voltage of said second and fourth field effect transistors respectively constituting said fourth variable resistor and said sixth variable resistor are set such that the gain control voltage that causes said first field effect transistor constituting said third variable resistor to go completely off agrees with the gain control voltage that causes said third field effect transistor constituting said fifth variable resistor to go completely off, and such that the gain control voltage that causes said second field effect transistor constituting said fourth variable resistor to go completely off agrees with the gain control voltage that causes said fourth field effect transistor constituting said sixth variable resistor to go completely off.

35. A portable telephone terminal apparatus according to claim 26, wherein the threshold voltage of said first and third field effect transistors respectively constituting said third variable resistor and said fifth variable resistor and the threshold voltage of said second and fourth field effect transistors respectively constituting said fourth variable resistor and said sixth variable resistor are set such that the operation is performed in a state that the gain control voltage range where said fourth variable resistor and said sixth variable resistor perform gain control operation is higher than the gain control voltage range where said third variable resistor and said fifth variable resistor perform gain control operation.

* * * * *